United States Patent
Lim et al.

(10) Patent No.: US 12,125,834 B2
(45) Date of Patent: Oct. 22, 2024

(54) DISPLAY DEVICE AND METHOD OF FABRICATING THE SAME

(71) Applicant: SAMSUNG DISPLAY CO., LTD., Yongin-si (KR)

(72) Inventors: Bek Hyun Lim, Hwaseong-si (KR); Jung-Hwan Yi, Seoul (KR); Hee Keun Lee, Suwon-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 359 days.

(21) Appl. No.: 17/377,268

(22) Filed: Jul. 15, 2021

(65) Prior Publication Data

US 2022/0020734 A1  Jan. 20, 2022

(30) Foreign Application Priority Data

Jul. 15, 2020 (KR) ........................ 10-2020-0087463

(51) Int. Cl.
*H01L 29/18* (2006.01)
*H01L 23/00* (2006.01)
(Continued)

(52) U.S. Cl.
CPC ............ *H01L 25/167* (2013.01); *H01L 24/95* (2013.01); *H01L 27/124* (2013.01); *H01L 33/62* (2013.01);
(Continued)

(58) Field of Classification Search
CPC ..... H01L 25/167; H01L 24/95; H01L 27/124; H01L 33/62; H01L 2224/95102; H01L 2224/95145; H01L 2924/12041; H01L 33/18; H01L 25/0753; H01L 21/67763; H01L 21/67775; H01L 21/67778;
(Continued)

(56) References Cited

U.S. PATENT DOCUMENTS

2011/0089850 A1   4/2011   Shibata et al.
2011/0254043 A1  10/2011   Negishi et al.
(Continued)

FOREIGN PATENT DOCUMENTS

KR   10-2012-0122159 A   11/2012
KR   10-2015-0006798 A   1/2015
(Continued)

*Primary Examiner* — Ismail A Muse
(74) *Attorney, Agent, or Firm* — Lewis Roca Rothgerber Christie LLP

(57) ABSTRACT

A display device includes a first substrate; a first conductive pattern, a first voltage line and a second voltage line on the first substrate; an insulating layer on the first conductive pattern and the second voltage line; a plurality of first light-emitting elements on the insulating layer; a first electrode on the insulating layer and connected to the first conductive pattern, the first electrode overlapping the first voltage line; and a second electrode on the insulating layer and connected to the second voltage line, wherein the plurality of first light-emitting elements are in contact with the first electrode and the second electrode, and wherein a part of an upper surface of the first electrode that overlaps the first conductive pattern and a part of the upper surface of the first electrode that overlaps the first voltage line are located on the same plane.

13 Claims, 20 Drawing Sheets

(51) Int. Cl.
*H01L 25/16* (2023.01)
*H01L 33/00* (2010.01)
*H01L 27/12* (2006.01)
*H01L 33/62* (2010.01)

(52) U.S. Cl.
CPC ............... *H01L 2224/95102* (2013.01); *H01L 2224/95145* (2013.01); *H01L 2924/12041* (2013.01)

(58) Field of Classification Search
CPC ..... H01L 25/50; H01L 33/005; H01L 23/485; H01L 23/528; H01L 23/544
See application file for complete search history.

(56) References Cited

U.S. PATENT DOCUMENTS

| | | | |
|---|---|---|---|
| 2014/0145237 A1 | 5/2014 | Do et al. | |
| 2018/0019369 A1* | 1/2018 | Cho | ........................ H05K 1/181 |
| 2018/0175106 A1* | 6/2018 | Kim | ........................ H01L 33/60 |
| 2020/0235077 A1* | 7/2020 | Jeon | ................... H01L 33/0095 |

FOREIGN PATENT DOCUMENTS

| | | |
|---|---|---|
| KR | 10-2020-0005711 A | 1/2020 |
| WO | WO 2019-208880 A1 | 10/2019 |

* cited by examiner

DISPLAY DEVICE AND METHOD OF FABRICATING THE SAME

CROSS-REFERENCE TO RELATED APPLICATION

This application claims priority to and the benefit of Korean Patent Application No. 10-2020-0087463 filed on Jul. 15, 2020 in the Korean Intellectual Property Office, the entire content of which is incorporated herein by reference.

BACKGROUND

1. Field

One or more embodiments of the present disclosure relate to a display device, and a method of fabricating the same.

2. Description of the Related Art

Display devices become more and more important as multimedia technology evolves. Accordingly, a variety of types (or kinds) of display devices, such as organic light-emitting display (OLED) devices and/or liquid-crystal display (LCD) devices, are currently used.

Display devices are for displaying images and include a display panel, such as an organic light-emitting display panel or a liquid-crystal display panel. Among them, light-emitting display panel may include light-emitting elements. For example, light-emitting diodes (LEDs) may include an organic light-emitting diode (OLED) using an organic material as a fluorescent material, and an inorganic light-emitting diode using an inorganic material as a fluorescent material.

An inorganic light-emitting diode using an inorganic semiconductor as the fluorescent material has advantageous in that it has durability in high-temperature environments and a higher efficiency of blue light than organic light-emitting diodes. Previously, the process of fabricating inorganic light-emitting diodes had certain shortcomings. However, a transfer method using dielectrophoresis (DEP) has been developed, and thus the shortcomings have been substantially overcome. Therefore, researches on inorganic light-emitting diodes are ongoing, as they have better durability and efficiency compared with organic light-emitting diodes.

SUMMARY

Aspects of one or more embodiments of the present disclosure provide a display device in which an alignment electrode is eliminated and light-emitting elements can be aligned more accurately.

Aspects one or more embodiments of the present disclosure also provide a method of fabricating a display device that can align light-emitting elements more accurately, by way of aligning the light-emitting elements using an alignment substrate including alignment elements, and then transferring the light-emitting elements onto a target substrate.

It should be noted that objects of the present disclosure are not limited to the above-mentioned object; and other objects of the present disclosure will be apparent to those skilled in the art from the following descriptions.

According to an one or more embodiments of the present disclosure, a display device does not include alignment electrodes and can include aligned light-emitting elements. A voltage applied to align the light-emitting elements may result in damage to other lines. Additionally, alignment electrodes may form an electric field together with lines or electrodes included in a lower substrate. The electric field thus formed may provide a dielectrophoretic force to the light-emitting elements, and thus the light-emitting elements may be aligned at undesirable positions. Accordingly, by eliminating the alignment electrodes, it is possible to reduce damage applied to the lines or electrodes included in the lower substrate and to align the light-emitting elements more accurately.

In addition, by way of aligning the light-emitting elements using a separate alignment substrate and then transferring the light-emitting elements onto a target substrate, it is possible to reduce damage applied to the lines included in the lower substrate and to align the light-emitting elements more accurately.

It should be noted that effects of the present disclosure are not limited to those described above and other effects of the present disclosure will be apparent to those skilled in the art from the following descriptions.

An embodiment of a display device includes a first substrate; a first conductive pattern, a first voltage line and a second voltage line on the first substrate; an insulating layer on the first conductive pattern and the second voltage line; a plurality of first light-emitting elements on the insulating layer, wherein a longitudinal direction of the a plurality of light-emitting elements is along a first direction; a first electrode on the insulating layer and connected to the first conductive pattern through a first contact hole penetrating the insulating layer, at least a portion of the first electrode overlapping the first voltage line; and a second electrode on the insulating layer and connected to the second voltage line through a second contact hole penetrating the insulating layer, wherein the plurality of first light-emitting elements are in an area that extends along a second direction crossing the first direction, wherein a side surface of a first end of each of the plurality of first light-emitting elements in the longitudinal direction is in contact with the first electrode, wherein a side surface of a second end of each of the plurality of first light-emitting elements in the longitudinal direction is in contact with the second electrode, and wherein a part of an upper surface of the first electrode that overlaps the first conductive pattern and a part of the upper surface of the first electrode that overlaps the first voltage line are located on a same plane.

An embodiment of a method for fabrication a display device, the method includes preparing an alignment substrate comprising alignment electrodes; ejecting an ink containing light-emitting elements onto the alignment substrate; aligning the light-emitting elements by applying an alignment signal to the alignment electrodes; and transferring the aligned light-emitting elements to a target substrate.

BRIEF DESCRIPTION OF THE DRAWINGS

The above and other aspects and features of the present disclosure will become more apparent by describing in detail embodiments thereof with reference to the attached drawings, in which.

DETAILED DESCRIPTION

Figure 1:
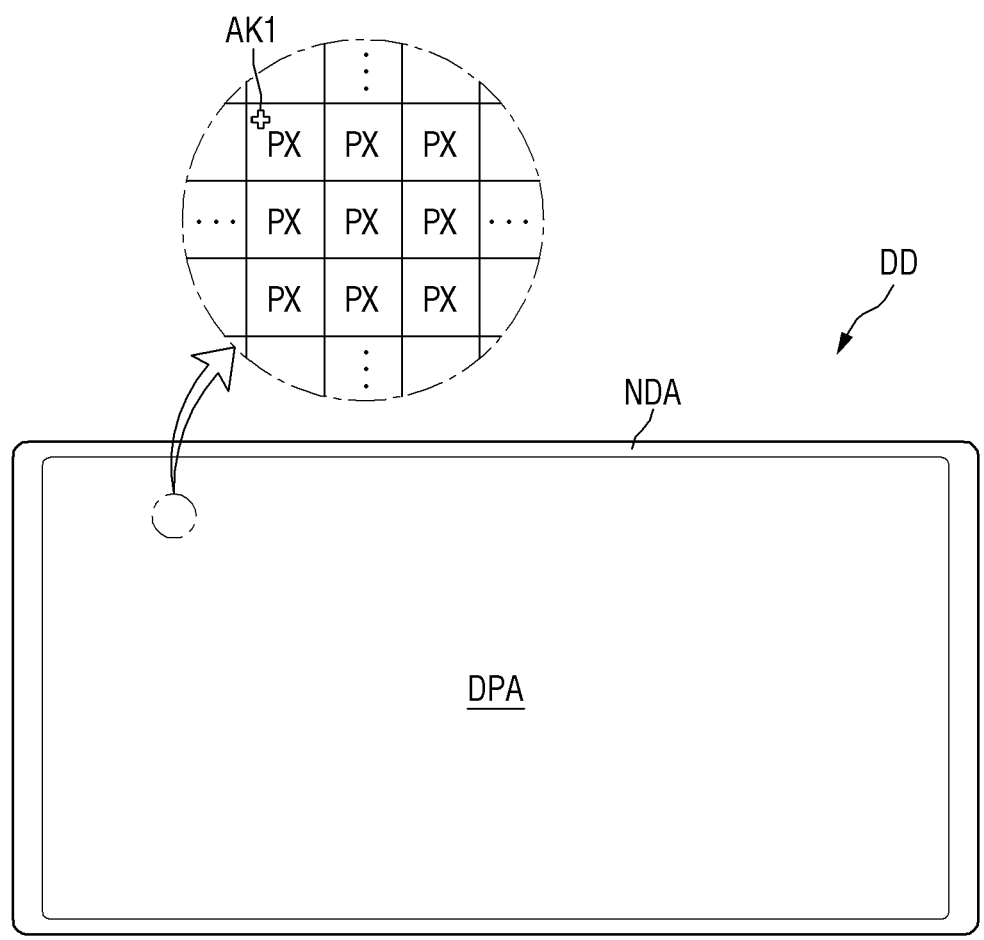
FIG. 1 is a plan view of a display device according to an one or more embodiments of the present disclosure.

The present disclosure will now be described more fully hereinafter with reference to the accompanying drawings, in which embodiments are shown. This disclosure may, however, be embodied in different forms and should not be construed as limited to the embodiments set forth herein. Rather, these embodiments are provided so that this disclosure will be thorough and complete, and will fully convey the scope of the disclosure to those skilled in the art.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Spatially relative terms, such as "beneath," "below," "lower," "above," "upper" and/or the like, may be used herein for ease of description to describe one element or feature's relationship to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "below" or "beneath" other elements or features would then be oriented "above" the other elements or features. Thus, the term "below", for example, can encompass both an orientation of above and below. The device may be otherwise oriented (rotated 90 degrees or at other orientations) and the spatially relative descriptors used herein interpreted accordingly.

The same reference numbers indicate the same components throughout the specification.

The term "and/or" includes one or more combinations which may be defined by relevant elements. Expressions such as "at least one of," "one of," and "selected from," when preceding a list of elements, modify the entire list of elements and do not modify the individual elements of the list. Further, the use of "may" when describing embodiments of the present disclosure refers to "one or more embodiments of the present disclosure."

As used herein, the terms "use," "using," and "used" may be considered synonymous with the terms "utilize," "utilizing," and "utilized," respectively.

In addition, the terms "substantially," "about," and similar terms are used as terms of approximation and not as terms of degree, and are intended to account for the inherent deviations in measured or calculated values that would be recognized by those of ordinary skill in the art.

Also, any numerical range recited herein is intended to include all sub-ranges of the same numerical precision subsumed within the recited range. For example, a range of "1.0 to 10.0" is intended to include all subranges between (and including) the recited minimum value of 1.0 and the recited maximum value of 10.0, that is, having a minimum value equal to or greater than 1.0 and a maximum value equal to or less than 10.0, such as, for example, 2.4 to 7.6. Any maximum numerical limitation recited herein is intended to include all lower numerical limitations subsumed therein and any minimum numerical limitation recited in this specification is intended to include all higher numerical limitations subsumed therein. Accordingly, Applicant reserves the right to amend this specification, including the claims, to expressly recite any sub-range subsumed within the ranges expressly recited herein.

Hereinafter, embodiments of the present disclosure will be described with reference to the accompanying drawings.

FIG. 1 is a plan view of a display device according to an one or more embodiments of the present disclosure.

Referring to FIG. 1, a display device DD displays a moving image or a still image. The display device DD may refer to any electronic device that provides a display screen. For example, the display device DD may include a television set, a laptop computer, a monitor, an electronic billboard, the Internet of Things devices, a mobile phone, a smart phone, a tablet personal computer (PC), an electronic watch, a smart watch, a watch phone, a head-mounted display device, a mobile communications terminal, an electronic notebook, an electronic book, a portable multimedia player (PMP), a navigation device, a game console and/or a digital camera, a camcorder, etc.

The display device DD includes a display panel for providing a display screen. Examples of the display panel may include an inorganic light-emitting diode display panel, an organic light-emitting display panel, a quantum-dot light-emitting display panel, a plasma display panel, a field emission display panel, etc. In the following description, an inorganic light-emitting diode display panel is employed as an example of the display panel 10, but the present disclosure is not limited thereto. Any other suitable display panel may be employed as long as the technical idea of the present disclosure can be equally applied.

The shape of the display device DD may be modified in a variety of suitable ways. For example, the display device DD may have shapes such as a rectangle with longer lateral sides, a rectangle with longer vertical sides, a square, a quadrangle with rounded corners (vertices), other polygons, a circle, etc. The shape of a display area DPA of the display device DD may also be similar to the overall shape of the display device DD. FIG. 1 shows the display device 1 and the display area DPA in the shape of a rectangle with longer horizontal sides.

The display device DD may include the display area DPA and a non-display area NDA. In the display area DPA, images can be displayed. In the non-display areas NDA, images are not displayed. The display area DPA may be referred to as an active area, while the non-display areas NDA may also be referred to as an inactive area. The display area DPA may generally occupy the center of the display device DD.

The display area DPA may include a plurality of pixels PX. The plurality of pixels PX may be arranged in a matrix. The shape of each pixel PX may be, but is not limited to, a rectangle or a square when viewed from the top. Each pixel may have a diamond shape having sides inclined with respect to a direction. The pixels PX may be arranged in stripes and PenTile®/PENTILE® fashion or pattern alternately (PENTILE® is a registered trademark owned by Samsung Display Co., Ltd.). Each of the pixels PX may include one or more light-emitting elements 30 (see FIG. 2) that emit light of particular wavelength bands to represent colors.

The non-display areas NDA may be around the display area DPA. The non-display areas NDA may surround the display area DPA entirely or partially. The display area DPA may have a rectangular shape, and the non-display areas NDA may be adjacent to the four sides of the display area DPA. The non-display area NDA may form the bezel of the display device DD. Lines or circuit drivers included in the display device DD may be located in the non-display area NDA, or external devices may be mounted.

Figure 9:
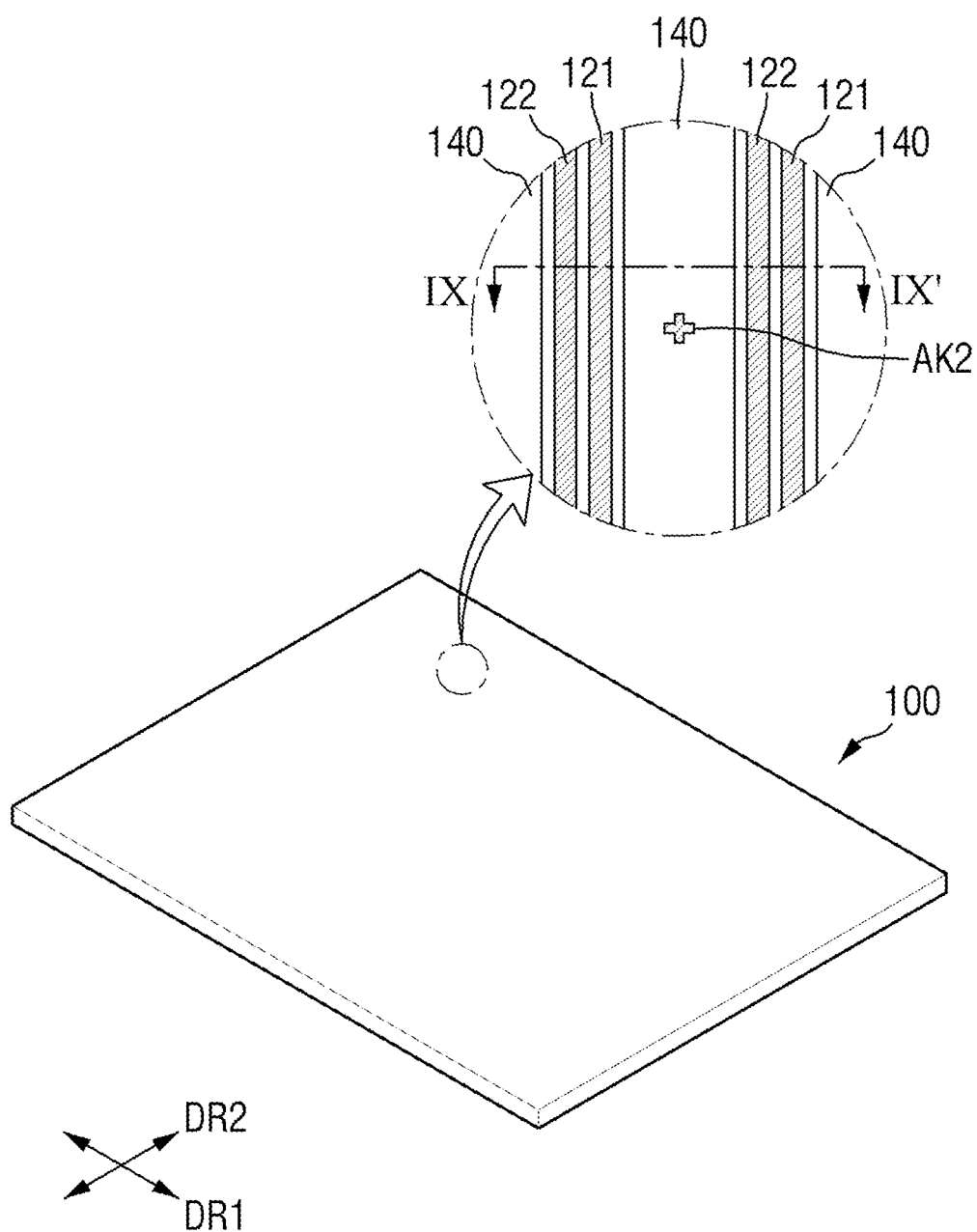
FIGS. 9 to 14 are schematic views showing processing steps of fabricating a display device according to one or more embodiments of the present disclosure.

A first alignment key AK1 may be inside the pixels PX. The first alignment key AK1 may be aligned with a second alignment key AK2 (see FIG. 9) to be described hereinbelow, to assist in aligning of the display device DD and the alignment substrate 100 (see FIG. 9). It is, however, to be understood that the present disclosure is not limited thereto. The first alignment key AK1 may be outside the pixels PX in the display area DPA, or in the non-display area NDA. For example, the first alignment key AK1 may have, but is not limited to, a cross shape.

Figure 2:
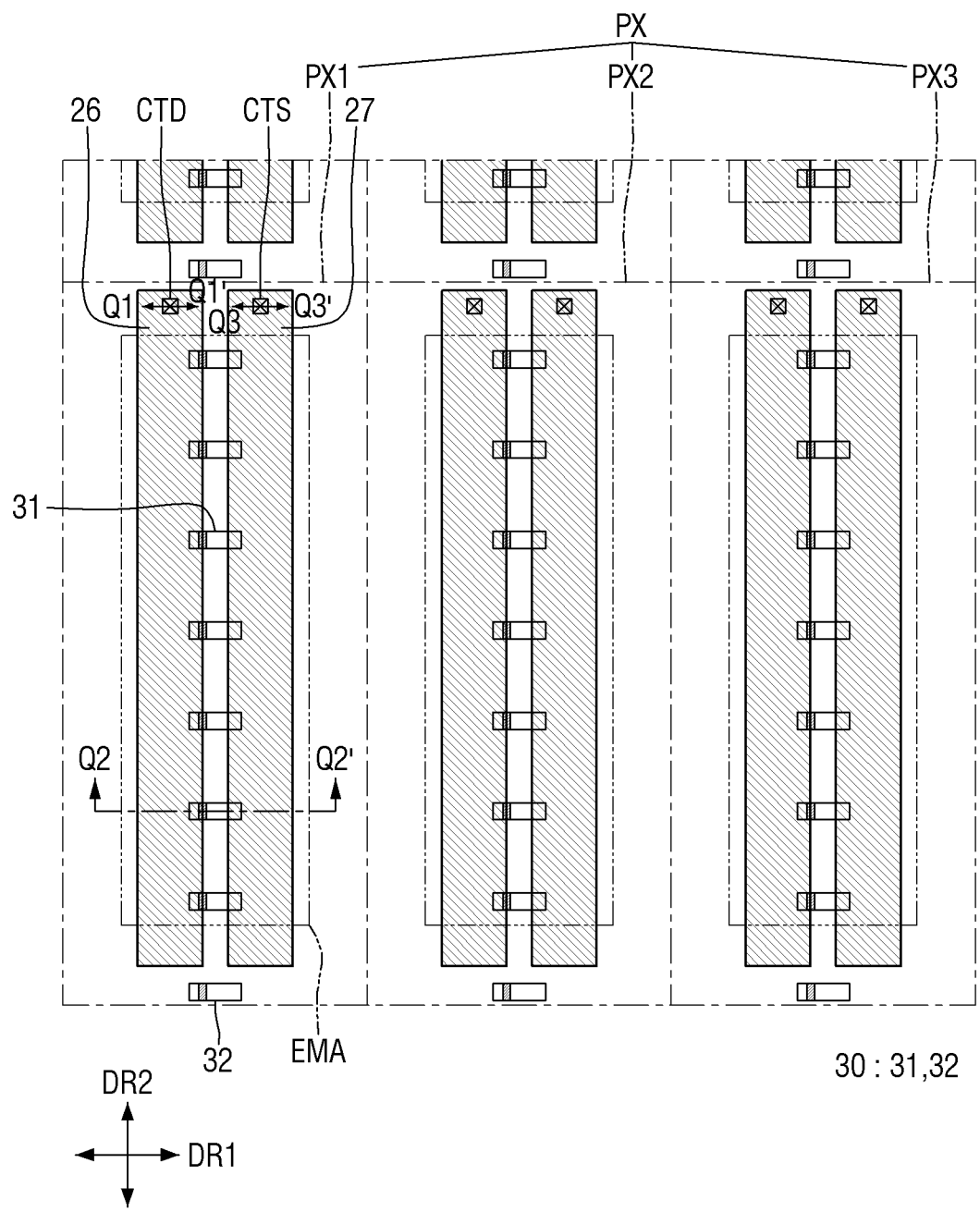
FIG. 2 is a plan view showing a pixel of a display device according to an one or more embodiments of the present disclosure.

FIG. 2 is a plan view showing a pixel of a display device according to an one or more embodiments of the present disclosure.

Referring to FIG. 2, each of the plurality of pixels PX may include a plurality of sub-pixels PXn, where n is an integer between one and three. For example, a pixel PX may include a first sub-pixel PX1, a second sub-pixel PX2 and a third sub-pixel PX3. The first sub-pixel PX1 may emit light of a first color, the second sub-pixel PX2 may emit light of a second color, and the third sub-pixel PX3 may emit light of a third color. The first color may be blue, the second color may be green, and the third color may be red. It is, however, to be understood that the present disclosure is not limited thereto. All the sub-pixels PXn may emit light of the same color. Although the pixel PX includes three sub-pixels PXn in the example shown in FIG. 2, the present disclosure is not limited thereto. The pixel PX may include more than two sub-pixels PXn. Light-emitting elements 30 arranged in the second direction DR2 may be in each sub-pixel PXn. The light-emitting elements 30 may have a longitudinal direction in the first direction DR1 and may be arranged parallel to one another in the second direction DR2. In addition, in each sub-pixel PXn, a first electrode 26 and a second electrode 27, extended in the second direction DR2 and spaced apart from each other in the first direction DR1, may be further provided. The first electrode 26 and the second electrode 27 in a pixel row may be separated from those in other pixel rows arranged in the second direction DR2.

The light-emitting elements 30 may include first light-emitting elements 31 overlapping the first electrode 26 and the second electrode 27 in the thickness direction, and second light-emitting elements 32 not overlapping the first electrode 26 and the second electrode 27.

The second light-emitting elements 32 may be positioned on the first planarization layer 19 in an area extended in the second direction DR2 from the area in which the first light-emitting elements 31 are arranged, so that their longitudinal direction is orientated toward the first direction DR1. The second light-emitting elements 32 may be at the boundary between the pixel rows, where neither the first electrode 26 nor the second electrode 27 is located. The second light-emitting elements may be in contact (e.g., physical contact) with neither the first electrode 26 nor the second electrode 27. The figure formed by extending the second light-emitting elements 32 in the first direction DR1 may not meet any of the first electrode 26 and the second electrode 27.

The first light-emitting elements 31 may be electrically connected to the first electrode 26 and the second electrode 27 to actually (e.g., actively) emit light, whereas the second light-emitting elements 32 may be dummy light-emitting elements that do not emit light.

Each of the sub-pixels PXn of the display device DD may include an emission area EMA and a non-emission area. In the emission area EMA, the light-emitting elements 31 may to emit light of a particular (or set) wavelength. In the non-emission area, the light-emitting elements 31 are not provided, or the second light-emitting elements 32 that are not electrically connected to the first electrode 26 or the second electrode 27 are provided, and thus no light exits therefrom. An active layer 36 (see FIG. 7) of each of the light-emitting elements 30 may emit light without directivity. The light may be emitted in both side directions of the light-emitting elements 30. The emission area EMA may include an area in which the first light-emitting elements 31 are provided, and may include an area adjacent to the light-emitting elements 31, where light emitted from the first light-emitting elements 31 exits.

It is, however, to be understood that the present disclosure is not limited thereto. The emission area may also include an area in which light emitted from the first light-emitting elements 31 is reflected or refracted by other elements to exit. The plurality of first light-emitting elements 31 may be in each of the sub-pixels PXn, and the emission area may include the area where the first light-emitting elements are positioned, and the adjacent area. A more detailed description thereon will be given below.

Figure 3:
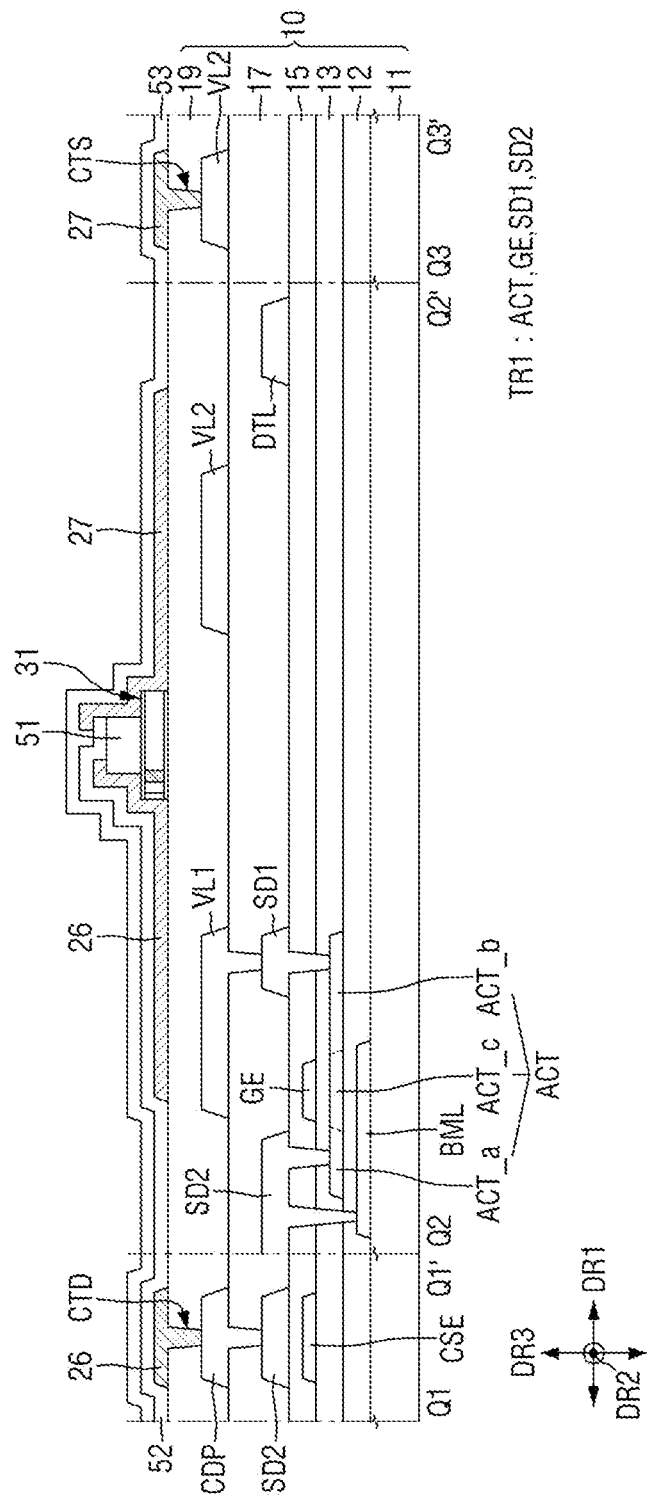
FIG. 3 is a cross-sectional view taken along lines Q1-Q1', Q2-Q2' and Q3-Q3' of FIG. 2.

FIG. 3 is a cross-sectional view taken along lines Q1-Q1', Q2-Q2' and Q3-Q3' of FIG. 2. Although FIG. 3 shows only a cross section of the first sub-pixel PX1 of FIG. 2, the description may be equally applied to the other pixels PX or sub-pixels PXn. FIG. 3 shows the cross section traversing from a first end to a second end of a first light-emitting element 31 in a first sub-pixel PX1.

Referring to FIG. 3 in conjunction with FIG. 2, the display device DD may include a base substrate 11, a semiconductor layer on the base substrate 11, a plurality of conductive layers, and a plurality of insulating layers.

In one or more embodiments, the base substrate 11 may be an insulating substrate. The base substrate 11 may be made of an insulating material such as glass, quartz and/or a polymer resin. The base substrate 11 may be either a rigid substrate or a flexible substrate that can be bent, folded, and/or rolled.

A light-blocking layer BML may be on the base substrate 11. The light-blocking layer BML may overlap an active material layer ACT of a first transistor TR1 of the display device DD. The light-blocking layer BML may include a material that blocks light, and thus can prevent or reduce the entry of light into the active material layer ACT of the first transistor. For example, the light-blocking layer BML may be formed of an opaque metal material that blocks or reduces light transmission. It is, however, to be understood that the present disclosure is not limited thereto. In some implementations, the light-blocking layer BML may be eliminated.

A buffer layer 12 may be entirely on the base substrate 11, including the light-blocking layer BML. The buffer layer 12 may be formed on the base substrate 11 to protect the first thin-film transistors (e.g., first transistors) TR1 of the pixels PX from moisture permeating through the base substrate 11 that is susceptible to moisture permeation, and to provide a flat surface. The buffer layer 12 may be formed of a plurality of inorganic layers stacked on one another alternately. For example, the buffer layer 12 may be made up of multiple layers, in which inorganic layers including at least one of a silicon oxide (SiOx), a silicon nitride (SiNx) or silicon oxynitride (SiOxNy), are stacked on one another alternately.

The semiconductor layer is on the buffer layer 12. The semiconductor layer may include the active material layer ACT of the first transistor TR1. These may partially overlap with a gate electrode GE of a first gate conductive layer, etc., which will be described hereinbelow.

Although only the first transistor TR1 among the transistors included in the sub-pixels PXn of the display device DD is depicted in the drawing, the present disclosure is not limited thereto. The display device DD may include a larger number of transistors. For example, the display device DD may include more than one transistor, in addition to the first transistor TR1, e.g., two or three transistors in each of the sub-pixels PXn.

According to one or more embodiments of the present disclosure, the semiconductor layer may include polycrystalline silicon, monocrystalline silicon, an oxide semiconductor, etc. The polycrystalline silicon may be formed by crystallizing amorphous silicon. When the semiconductor layer contains polycrystalline silicon, the active material layer ACT may include a plurality of doped regions ACT_a and ACT_b doped with impurities, and a channel region ACT_c between them. For example, the plurality of doped regions ACTa and ACTb may be source/drain electrodes, respectively.

In one or more embodiments, the semiconductor layer may include an oxide semiconductor. In such case, each of the doped regions of the active material layer ACT may be a conductive region. The oxide semiconductor may be an oxide semiconductor containing indium (In). In one or more embodiments, the oxide semiconductor may be indium-tin oxide (ITO), indium-zinc oxide (IZO), indium-gallium oxide (IGO), indium-zinc-tin oxide (IZTO), indium-gallium-tin oxide (IGTO), indium-gallium-zinc-tin oxide (IGZTO), etc. It is, however, to be understood that the present disclosure is not limited thereto.

A first gate insulating layer 13 is on the semiconductor layer and the buffer layer 12. The first gate insulating layer 13 may include the semiconductor layer, and may be on the buffer layer 12. The first gate insulating layer 13 may work as a gate insulator of each of the thin-film transistors. The first gate insulating layer 13 may be formed of an inorganic layer including an inorganic material, such as silicon oxide (SiOx), silicon nitride (SiNx) and/or silicon oxynitride (SiON), or may be formed of a stack of the materials.

The first gate conductive layer is on the first gate insulating layer 13. The first gate conductive layer may include a first gate electrode GE of the first transistor TR1 and a first capacitor electrode CSE of a storage capacitor. The first gate electrode GE may overlap a channel region ACT_c of the active material layer ACT in the thickness direction. The first capacitor electrode CSE may overlap a first source/drain electrode SD1 of the first transistor TR1 in the thickness direction. In one or more embodiments, the first capacitor electrode CSE may be connected to and integrated with the first gate electrode GE, and the integrated layer may partially include the first gate electrode GE and the first capacitor electrode CSE. The first capacitor electrode CSE may overlap the first source/drain electrode SD1 in the thickness direction, and the storage capacitor may be formed between them.

The first gate conductive layer may be made up of a single layer or multiple layers of one of molybdenum (Mo), aluminum (Al), chromium (Cr), gold (Au), titanium (Ti), nickel (Ni), neodymium (Nd) and copper (Cu), or an alloy thereof. It is, however, to be understood that the present disclosure is not limited thereto.

The first protective layer 15 is on the first gate conductive layer. The first protective layer 15 may cover the first gate conductive layer and serve to protect it. The first protective layer 15 may be formed of an inorganic layer including an inorganic material, such as silicon oxide (SiOx), silicon nitride (SiNx) and/or silicon oxynitride (SiON), or may be formed of a stack of the materials.

A first data conductive layer is on the first protective layer 15. The first data conductive layer may include the first source/drain electrode SD1 and the second source/drain electrode SD2 of the first transistor TR1, and a data line DTL.

The source/drain electrodes SD1 and SD2 of the first transistor TR1 may be in contact (e.g., physical contact) with the doping regions ACT_a and ACT_b of the active material layer ACT, respectively, through the contact holes penetrating through the first protective layer 15 and the first gate insulating layer 13. In one or more embodiments, the first source/drain electrode SD1 of the first transistor TR1 may be electrically connected to the light-blocking layer BML through another contact hole.

The data line DTL may apply a data signal to another transistor included in the display device DD. In one or more embodiments, the data line DTL may be connected to a source/drain electrode of another transistor.

The first data conductive layer may be made up of a single layer or multiple layers of one of molybdenum (Mo), aluminum (Al), chromium (Cr), gold (Au), titanium (Ti), nickel (Ni), neodymium (Nd) and copper (Cu), or an alloy thereof. It is, however, to be understood that the present disclosure is not limited thereto.

The first interlayer dielectric layer 17 is on the first data conductive layer. The first interlayer dielectric layer 17 may serve as an insulating layer between the first data conductive layer and other layers thereon. In one or more embodiments, the first interlayer dielectric layer 17 may cover the first data conductive layer to protect it. The first interlayer dielectric layer 17 may be formed of an inorganic layer including an inorganic material, such as silicon oxide (SiOx), silicon nitride (SiNx) and/or silicon oxynitride (SiON), or may be formed of a stack of the materials.

The second data conductive layer is on the first interlayer dielectric layer 17. The second data conductive layer may include a first voltage line VL1, a second voltage line VL2, and a first conductive pattern CDP. A high-level voltage (or a first supply voltage) may be applied to the first voltage line VL1 to be supplied to the first transistor TR1, and a low-level voltage (or a second supply voltage) may be applied to the second voltage line VL2 to be supplied to the second electrode 27.

The first conductive pattern CDP may be electrically connected to the first source/drain electrode SD1 of the first transistor TR1 through a contact hole formed in the first interlayer dielectric layer 17. The first conductive pattern CDP may also come in contact (e.g., physical contact) with the first electrode 26. The first transistor TR1 may transfer the first supply voltage applied from the first voltage line VL1 to the first electrode 26 through the first conductive pattern CDP. At least a part of the first electrode 26 may overlap the first voltage line VL1. Although the second data conductive layer includes one second voltage line VL2 and one first voltage line VL1 in the example shown in the drawings, the present disclosure is not limited thereto. The second data conductive layer may include more than one first voltage lines VL1 and second voltage lines VL2.

The second data conductive layer may be made up of a single layer or multiple layers of one of molybdenum (Mo), aluminum (Al), chromium (Cr), gold (Au), titanium (Ti), nickel (Ni), neodymium (Nd) and copper (Cu), or an alloy thereof. It is, however, to be understood that the present disclosure is not limited thereto.

The first planarization layer 19 is on the second data conductive layer. The first planarization layer 19 may include an organic insulating material, e.g., an organic material such as polyimide (PI), to provide a flat (or a substantially flat) surface.

The base substrate 11 to the first planarization layer 19 described above may together be a lower substrate 10. The first light-emitting element 31 and a plurality of electrodes 26 and 27 are on the first planarization layer 19. In one or more embodiments, a plurality of insulating layers 51, 52 and 53 may be further provided on the first planarization layer 19.

The first light-emitting element 31 may be directly on the first planarization layer 19. The plurality of first light-emitting elements 31 may be spaced apart from one another in the second direction DR2, and may be aligned substantially parallel to one another. The spacing between the first light-emitting elements 31 is not particularly limited herein. Each of the first light-emitting elements 31 has a shape extended in one direction. The direction in which electrodes 26 and 27 (to be described hereinbelow) are extended may be substantially perpendicular to the direction in which the first light-emitting elements 31 are extended. It is, however, to be understood that the present disclosure is not limited thereto. The first light-emitting elements 31 may be oriented obliquely to the direction in which the electrodes 26 and 27 are extended, rather than being perpendicular to it.

Each of the first light-emitting elements 31 may include an active layer 36 including different materials to emit light of different wavelength bands to the outside. The display device DD may include the first light-emitting elements 31 that emit light of different wavelengths. For example, the first light-emitting element 31 of the first sub-pixel PX1 may include the active layer 36 that emits light of a first color having a first wavelength as the center wavelength band, the first light-emitting element 31 of the second sub-pixel PX2 may include the active layer 36 that emits light of a second color having a second wavelength as the center wavelength band, and the first light-emitting element 31 of the third sub-pixel PX3 may include the active layer 36 that emits light of a third color having a third wavelength as the center wavelength band. Accordingly, lights of the first color, the second color and the third color may be emitted from the first sub-pixel PX1, the second sub-pixel PX2 and the third sub-pixel PX3, respectively. It is, however, to be understood that the present disclosure is not limited thereto. In some implementations, the sub-pixels PXn may include the same kind of first light-emitting elements 31, and may emit light of substantially the same color.

The first insulating layer 51 may be partially on the first light-emitting element 31. The first insulating layer 51 may partially surround the outer surface of the first light-emitting element 31. The first insulating layer 51 is provided on the first light-emitting element 31, but does not cover the first end and the second end of the first light-emitting element 31, so that the electrodes 26 and 27 can be in contact (e.g., physical contact) with the two ends of the first light-emitting element 31. The part of the first insulating layer 51 on the first light-emitting element 31 may have a shape extended in the second direction DR2 on the first light-emitting element 31 when viewed from the top. For example, the first insulating layer 51 may form a linear or island pattern in each sub-pixel PXn. The first insulating layer 51 may surround the outer surface of the first light-emitting element 31 to protect the first light-emitting element 31 and, at the same time, to fix (e.g., stabilize) the first light-emitting element 31 during the process of fabricating the display device DD.

A plurality of electrodes 26 and 27 and a second insulating layer 52 may be on the first insulating layer 51.

The electrodes 26 and 27 are provided on the first planarization layer 19. The electrodes 26 and 27 may include the first electrode 26 and the second electrode 27. The first and second electrodes 26 and 27 may be extended in the second direction DR2 and may be spaced apart from each other in the first direction DR1. The electrodes 26 and 27 may be electrically connected to the first light-emitting elements 31, and may receive a predetermined (or set) voltage so that the first light-emitting elements 31 can emit light. For example, the plurality of electrodes 26 and 27 may be electrically connected to the first light-emitting element 31, and may transfer electrical signals applied thereto to the first light-emitting element 31.

The first electrode 26 and the second electrode 27 may be in each sub-pixel PXn. The first electrode 26 and the second electrode 27 may be extended in the second direction DR2 in each sub-pixel PXn, and may be separated from other electrodes 26 and 27 of another sub-pixel PXn adjacent to the sub-pixels PXn in the second direction DR2 at the boundary therebetween.

The first electrode 26 may be electrically connected to the first transistor TR1 through a first contact hole CTD, and the second electrode 27 may be electrically connected to the second voltage line VL2 through a second contact hole CTS. For example, the first electrode 26 may be in contact (e.g., physical contact) with the first conductive pattern CDP through the first contact hole CTD penetrating the first planarization layer 19. The part of the upper surface of the first electrode 26 that overlaps the first conductive pattern CDP and the part of the upper surface of the first electrode 26 that overlaps the first voltage line VL1 may be located on the same plane. It is, however, to be understood that the present disclosure is not limited thereto. The second electrode 27 may be in contact (e.g., physical contact) with the second voltage line VL2 through the second contact hole CTS penetrating through the first planarization layer 19. For example, the first light-emitting element 31 and the first contact hole CTD may be physically connected by the single conductive layer, e.g., by the first electrode 26. In addition, the first light-emitting element 31 and the second contact hole CTS may be physically connected by the single conductive layer, e.g., by the second electrode 27.

Although one first electrode 26 and one second electrode 27 is shown in each sub-pixel PXn in the drawings, the present disclosure is not limited thereto. In one or more embodiments, a greater number of first electrodes 26 and second electrodes 27 may be provided in each sub-pixel PXn. The first electrode 26 and the second electrode 27 in each sub-pixel PXn may not necessarily have a shape extended in one direction, but may have a variety of suitable structures. For example, the first electrode 26 and the second electrode 27 may have a partially curved or bent shape, and one electrode may surround the other electrode. The structure or shape of the first electrode 26 and the second electrode 27 are not particularly limited as long as they are spaced apart from and face each other at least partially.

The first electrode 26 and the second electrode 27 may be spaced apart from and face each other in the first direction DR1. At least a part of each of the first electrode 26 and the second electrode 27 may be directly on the first planarization layer 19. The first electrode 26 may be in contact (e.g., physical contact) with a first end surface of the first light-emitting element 31, and the second electrode 27 may be in contact (e.g., physical contact) with a second end surface of the first light-emitting element 31. The first end of the first light-emitting element 31 may be between the first planarization layer 19 and the first electrode 26, and the second end of the first light-emitting element 31 may be between the first planarization layer 19 and the second electrode 27. The first end of the first light-emitting element 31 may overlap the first electrode 26 and the second end thereof may overlap the second electrode 27. The first electrode 26 and the second electrode 27 may be spaced apart from and face each other in the first direction DR1, and they may form a stripe pattern inside the emission area EMA of each sub-pixel PXn. The distance between the first electrode 26 and the second electrode 27 in the first direction DR1 may be smaller than the length of the first light-emitting element 31 in the first direction DR1. The semiconductor layer of the first light-emitting element 31 may be exposed at both end surfaces of the first light-emitting element 31 in its extension direction, and the first electrode 26 and the second electrode 27 may be in contact (e.g., physical contact) with the first light-emitting element 31 at the end surfaces where the semiconductor layer is exposed.

According to one or more embodiments of the present disclosure, one of the first electrode 26 and the second electrode 27 may be electrically connected to an anode electrode of the first light-emitting element 31, while the other one may be electrically connected to a cathode electrode of the first light-emitting element 31. It is, however, to be understood that the present disclosure is not limited thereto.

Although one first electrode 26 and one second electrode 27 is shown in a single sub-pixel PXn in the drawings, the present disclosure is not limited thereto.

The second insulating layer 52 may be on the first electrode 26. The second insulating layer 52 can electrically insulate the first electrode 26 from the second electrode 27. The second insulating layer 52 may cover the first electrode 26 and may not be on the second end of the first light-emitting element 31, so that the first light-emitting element 31 comes in contact (e.g., physical contact) with the second electrode 27. The second insulating layer 52 may be in contact (e.g., physical contact) with a part of each of the first electrode 26 and the first insulating layer 51 on the upper surface of the first insulating layer 51. The side surface of the second insulating layer 52 where the second electrode 27 is positioned may be aligned with the side surface of the first insulating layer 51. In one or more embodiments, the second insulating layer 52 may also be in the non-emission area, for example, on the first planarization layer 19. It is, however, to be understood that the present disclosure is not limited thereto.

The second electrode 27 is on the first insulating layer 51 and the second insulating layer 52. The second electrode 27 may be in contact (e.g., physical contact) with the second end of the first light-emitting element 31. A part of the second electrode 27 may be in contact (e.g., physical contact) with the first insulating layer 51, the second insulating layer 52 and the first light-emitting element 31. The first electrode 26 and the second electrode 27 may not be in contact (e.g., physical contact) with each other, and may be insulated from each other by the first insulating layer 51 and the second insulating layer 52. It is, however, to be understood that the present disclosure is not limited thereto. In some implementations, the second insulating layer 52 may be eliminated.

Each of the electrodes 26 and 27 may include a transparent conductive material. For example, each of the electrode layers 26 and 27 may include, but is not limited to, a material such as indium tin oxide (ITO), indium zinc oxide (IZO) and/or indium tin zinc oxide (ITZO). In one or more embodiments, each of the electrodes 26 and 27 may include a conductive material having a high reflectivity. For example, each of the electrodes 26 and 27 may include a metal such as silver (Ag), copper (Cu) and/or aluminum (Al) as the material having a high reflectivity.

It is, however, to be understood that the present disclosure is not limited thereto. Each of the electrodes 26 and 27 may have a structure in which one or more layers of a transparent conductive material and a metal layer having high reflectivity are stacked, or may be made up of a single layer including the transparent conductive material and the metal. In one or more embodiments, each of the electrodes 26 and 27 may have a stack structure of ITO/silver (Ag)/ITO, ITO/Ag/IZO or ITO/Ag/ITZO/IZO, or may be an alloy including aluminum (Al), nickel (Ni), lanthanum (La), etc.

The third insulating layer 53 may be entirely on the base substrate 11 (e.g., may entirely cover the base substrate 11). The third insulating layer 53 may protect elements on the base substrate 11 against the external environment.

Each of the above-described first insulating layer 51, second insulating layer 52 and third insulating layer 53 may include an inorganic insulating material or an organic insulating material. According to one or more embodiments of the present disclosure, the first insulating layer 51, the second insulating layer 52 and the third insulating layer 53 may each independently include an inorganic insulating material such as silicon oxide (SiOx), silicon nitride (SiNx), silicon oxynitride (SiOxNy), aluminum oxide ($Al_2O_3$) and/or aluminum nitride (AlN). In one or more embodiments, they may include, as an organic insulating material, an acrylic resin, an epoxy resin, a phenol resin, a polyamide resin, a polyimide resin, an unsaturated polyester resin, a polyphenylene resin, a polyphenylene sulfide resin, benzocyclobutene, a cardo resin, a siloxane resin, a silsesquioxane resin, polymethyl methacrylate, polycarbonate, a polymethyl methacrylate-polycarbonate synthetic resin, etc. It is, however, to be understood that the present disclosure is not limited thereto.

Figure 4:
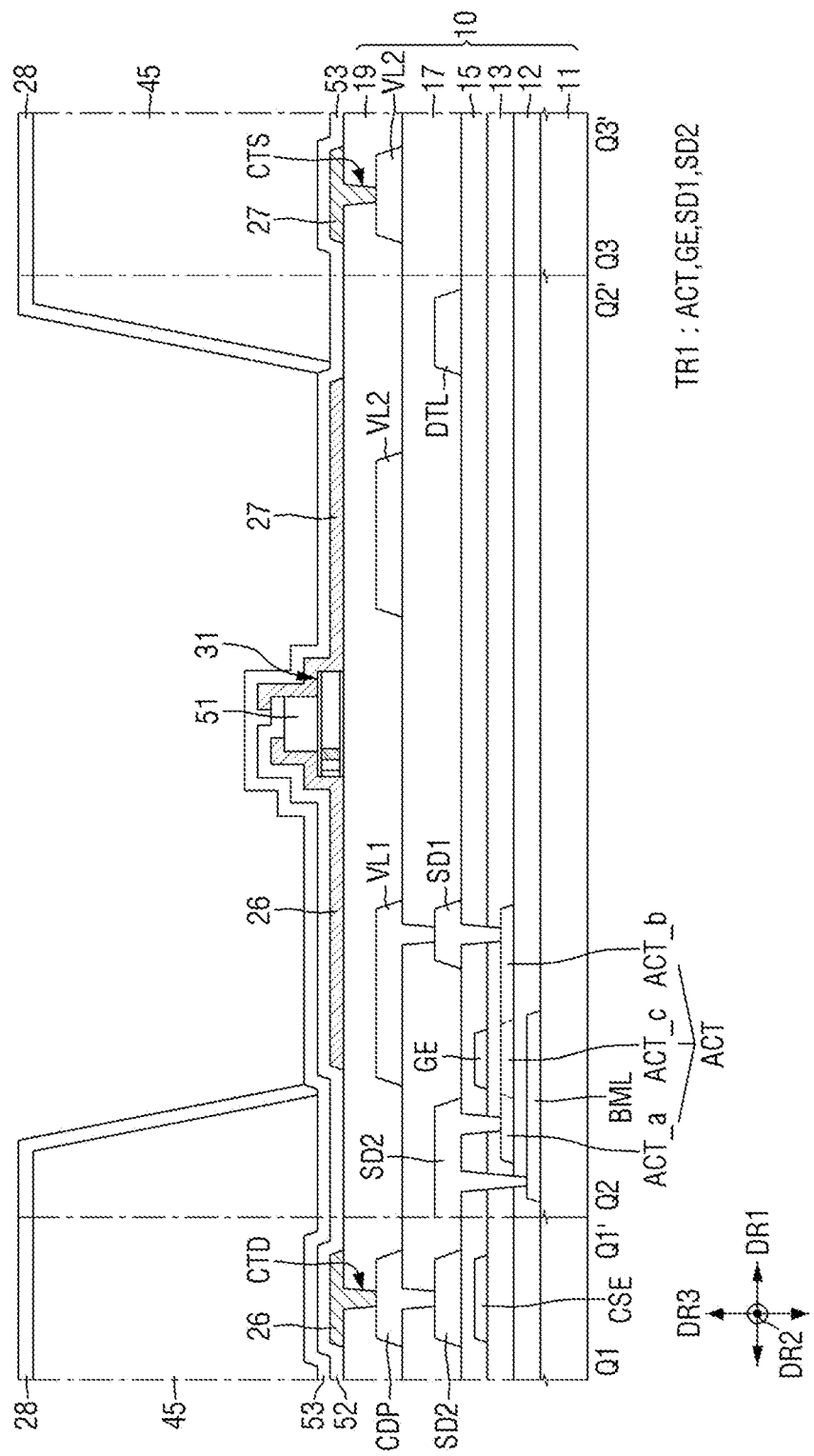
FIG. 4 is a cross-sectional view of a part of a display device according to one or more embodiments of the present disclosure.

FIG. 4 is a cross-sectional view of a part of a display device according to one or more embodiments of the present disclosure.

Referring to FIG. 4, the display device DD may further include a plurality of banks 45 and a plurality of third electrodes 28. The plurality of banks 45 may be on the third insulating layer 53. The banks 45 may be on one side of the first electrode 26 in the first direction DR1 and on the other side of the second electrode 27 in the first direction DR1, respectively. The third electrodes 28 may be provided on the banks 45, respectively. The plurality of banks 45 may be extended in the second direction DR2 in each sub-pixel PXn. In one or more embodiments, the plurality of banks 45 may be spaced apart from and face each other in the first direction DR1. The banks 45 may be spaced apart from each other to form a space in which the first light-emitting element 31 is provided therebetween. The first banks 45 may be in each sub-pixel PXn to form a linear pattern in the display area DPA of the display device DD. Although two first banks 45 are shown in the drawing, the present disclosure is not limited thereto.

Each of the banks 45 may have a structure that at least partially protrudes from the upper surface of the third insulating layer 53. The protruding part of each of the banks 45 may have an inclined side surface, and light emitted from the first light-emitting element 31 may proceed toward the inclined side surface of each of the banks 45. The third electrodes 28 on the banks 45 may cover at least the entire inclined side surfaces of the banks 45. The third electrodes 28 may include a material having a high reflectivity. Light emitted from the first light-emitting element 31 may be reflected off the third electrodes 28 on the side surfaces of the banks 45, and may exit through the upper side of the first planarization layer 19. For example, the banks 45 may provide the space in which the first light-emitting element 31 is positioned, and may also work as reflective partition walls that reflect light emitted from the first light-emitting element 31 upward. The side surfaces of the banks 45 may be inclined in a linear shape (e.g., the side surfaces of the banks 45 may be inclined straight lines), but the present disclosure is not limited thereto. The banks 45 may have a semicircle or semi-ellipse shape with curved outer surface. According to one or more embodiments of the present disclosure, the banks 45 may include, but are not limited to, an organic insulating material such as polyimide (PI). The embodiments of FIG. 4 are substantially identical to the embodiments of FIG. 3, except for including the plurality of banks 45 and the plurality of third electrodes 28. In the above description, redundant descriptions of the same elements will not be provided.

Figure 5:
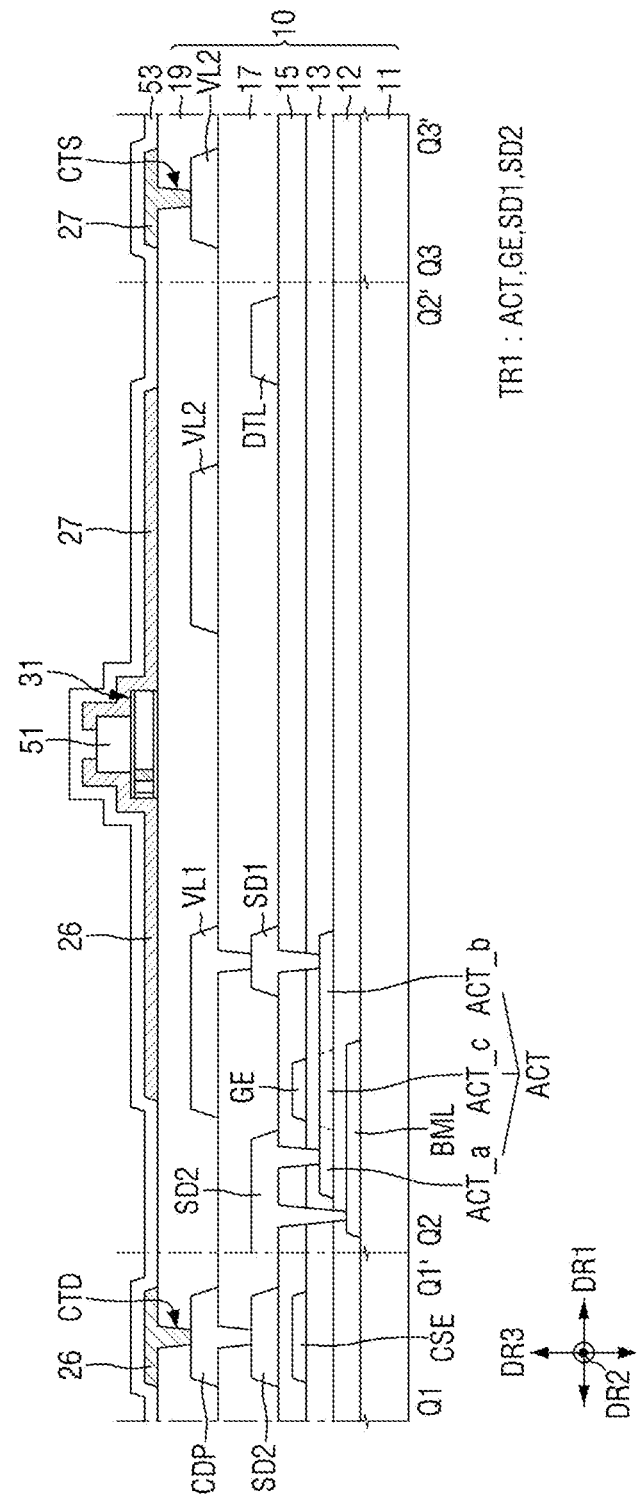
FIG. 5 is a cross-sectional view of a part of a display device according to one or more embodiments of the present disclosure.

FIG. 5 is a cross-sectional view of a part of a display device according to one or more embodiments of the present disclosure.

Referring to FIG. 5, the second insulating layer 52 may be eliminated (or omitted) from the display device DD. A part of the second electrode 27 may be directly on the first insulating layer 51, and the first electrode 26 and the second electrode 27 may be spaced apart from each other on the first insulating layer 51. According to one or more embodiments, even though the second insulating layer 52 is eliminated, the first insulating layer 51 includes an organic insulating material, so that the first light-emitting element 31 can be fixed in the display device DD. In one or more embodiments, the first electrode 26 and the second electrode 27 may be formed together via a patterning process. The embodiment of FIG. 5 are substantially identical to the embodiments of FIG. 3, except that the third insulating layer 53 is further eliminated. In the above description, redundant descriptions of the same elements will not be provided.

Figure 6:
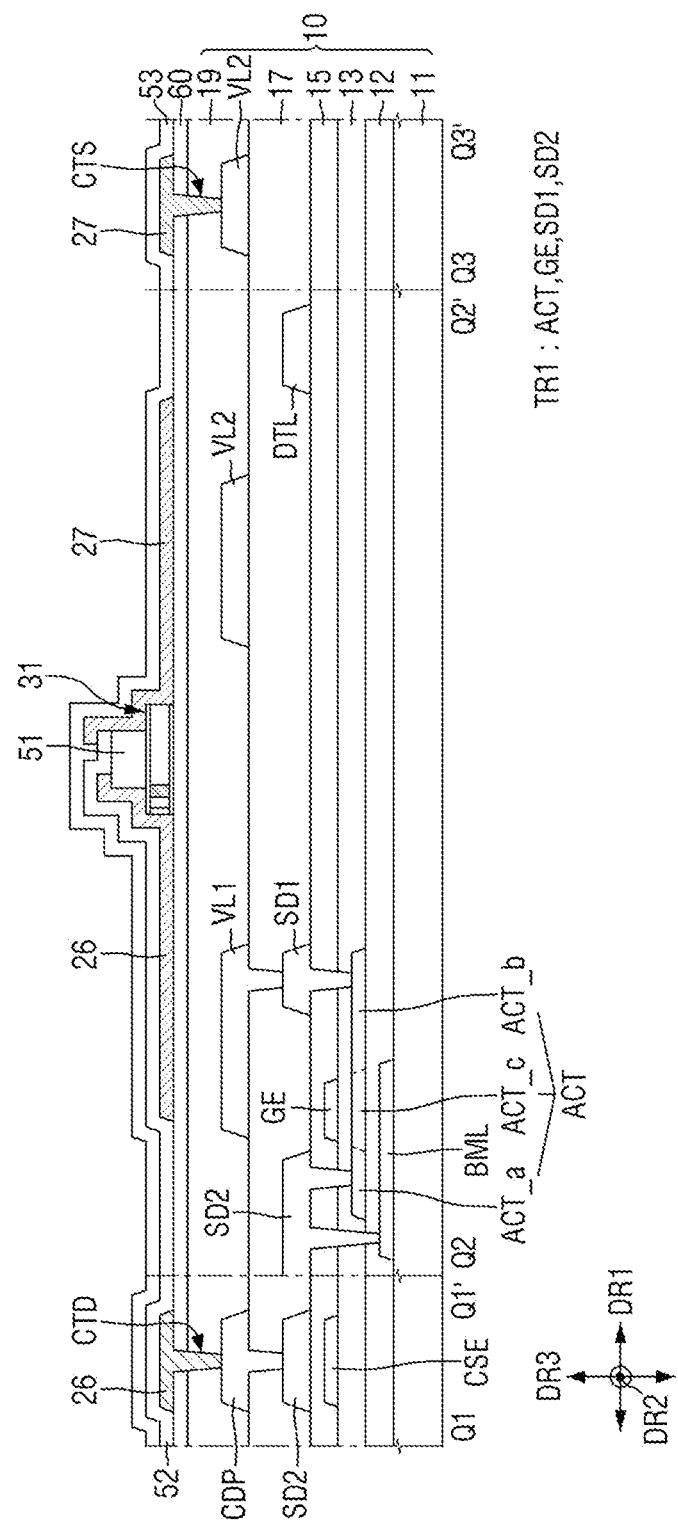
FIG. 6 is a cross-sectional view of a part of a display device according to one or more embodiments of the present disclosure.

FIG. 6 is a cross-sectional view of a part of a display device according to one or more embodiments of the present disclosure.

Referring to FIG. 6, a display device DD may further include an adhesive layer 60. The adhesive layer 60 may be on a first planarization layer 19. A first electrode 26, a second electrode 27, a second insulating layer 52 and a third insulating layer 53 may be on the adhesive layer 60. In the process of fabricating the display device DD, a first contact hole CTD and a second contact hole CTS may be formed after the adhesive layer 60 is formed. Accordingly, the first contact hole CTD and the second contact hole CTS may penetrate the adhesive layer 60. The adhesive layer 60 may be made of, but is not limited to, a material including an epoxy-based polymer such as SU-8, benzocyclobutene (BCB), polyimide (PI), polybenzoxazole (PBO), silicone (Si) and/or heat release coating. The embodiments of FIG. 6 are substantially identical to the embodiments of FIG. 3, except that the former further includes the adhesive layer 60. In the above description, redundant descriptions of the same elements will not be provided. In one or more embodiments, the adhesive layer 60 may be on the first planarization layer 19 in the embodiments of FIGS. 4 and 5.

Figure 7:
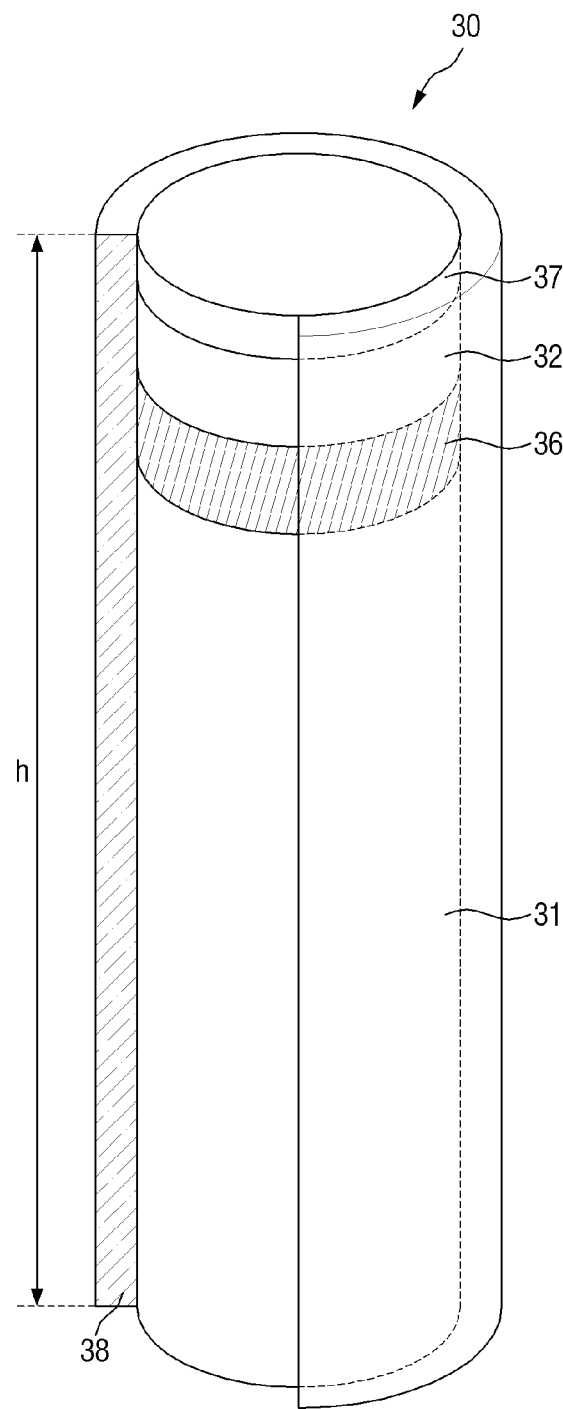
FIG. 7 is a view showing a light-emitting element according to one or more embodiments of the present disclosure.

FIG. 7 is a view showing a light-emitting element according to an one or more embodiments of the present disclosure.

The light-emitting element 30 may be a light-emitting diode. For example, the light-emitting element 30 may have a size in micrometers or nanometers, and may be an inorganic light-emitting diode made of an inorganic material. Inorganic light-emitting diodes may be aligned between two electrodes facing each other, as polarities are created by forming an electric field in a particular direction between the two electrodes. The light-emitting elements 30 may be aligned between two electrodes by an electric field formed over the two electrodes.

The light-emitting element 30 may include a semiconductor layer doped with impurities of a conductive type (or kind) (e.g., p-type or n-type). The semiconductor layer may emit light of a certain (or set) wavelength band by transmitting an electric signal applied from an external power source.

As shown in FIG. 7, the light-emitting element 30 may include a first semiconductor layer 31, a second semiconductor layer 32, an emissive layer 36, an electrode layer 37 and an insulating layer 38.

The first semiconductor layer 31 may be an n-type semiconductor. For example, when the light-emitting element 30 emits light of a blue wavelength band, the first semiconductor layer 31 may include a semiconductor material having the following chemical formula: $Al_xGa_yIn_{1-x-y}N$ ($0 \leq x \leq 1$, $0 \leq y \leq 1$, $0 \leq x+y \leq 1$).

The second semiconductor layer 32 is on the emissive layer 36 to be described hereinbelow. The second semiconductor layer 32 may be a p-type semiconductor. For example, when the light-emitting element 30 emits light of a blue or green wavelength band, the second semiconductor layer 32 may include a semiconductor material having the following chemical formula: $Al_xGa_yIn_{1-x-y}N$ ($0 \leq x \leq 1$, $0 \leq y \leq 1$, $0 \leq x+y \leq 1$).

The emissive layer 36 is between the first semiconductor layer 31 and the second semiconductor layer 32. The emissive layer 36 may include a material having a single or multiple quantum well structure. When the emissive layer 36 includes a material having the multiple quantum well structure, the structure may include quantum layers and well layers alternately stacked on one another. The emissive layer 36 may emit light as electron-hole pairs are combined therein, in response to an electrical signal applied through the first semiconductor layer 31 and the second semiconductor layer 32. For example, when the emissive layer 36 emits light of the blue wavelength band, it may include a material such as AlGaN and AlGaInN.

The electrode layer 37 may be an ohmic contact electrode. It is, however, to be understood that the present disclosure is not limited thereto. The element electrode layer may be Schottky contact electrodes. The light-emitting element 30 may include at least one electrode layer 37.

The electrode layer 37 can reduce the resistance between the light-emitting element 30 and the electrodes, or the contact electrodes, when the light-emitting element 30 is electrically connected to the electrodes, or the contact electrodes, in the display device DD according to one or more embodiments of the present disclosure. The electrode layer 37 may include a metal having conductivity. For example, the electrode layer 37 may include at least one of aluminum (Al), titanium (Ti), indium (In), gold (Au), silver (Ag), indium tin oxide (ITO), indium zinc oxide (IZO) or indium tin-zinc oxide (ITZO). In one or more embodiments, the electrode layer 37 may include a semiconductor material doped with n-type or p-type impurities.

The insulating layer 38 may surround the outer surfaces of the plurality of semiconductor layers and electrode layers described above. According to an one or more embodiments of the present disclosure, the insulating layer 38 may surround at least the outer surface of the emissive layer 36, and may be extended in a direction in which the light-emitting element 30 is extended. The insulating layer 38 may serve to protect the above-described elements. For example, the insulating layer 38 may be formed to surround the side surfaces of the elements, and both ends of the light-emitting element 30 in the longitudinal direction may be exposed.

The insulating layer 38 may include materials having an insulating property such as silicon oxide (SiOx), silicon nitride (SiNx), silicon oxynitride (SiOxNy), aluminum nitride (AlN) and/or aluminum oxide ($Al_2O_3$). Accordingly, it is possible to prevent an electrical short-circuit that may occur when the emissive layer 36 comes in contact (e.g., physical contact) with an electrode through which an electric signal is transmitted to the light-emitting element 30. In addition, because the insulating layer 38 also covers the outer surface of the emissive layer 36, it is possible to prevent or reduce a decrease in luminous efficiency.

The length h of the light-emitting elements 30 may be in a range from about 1 μm to about 10 μm, or from about 2 μm to about 6 μm, and in some embodiments, about 3 μm to about 5 μm. The diameter of the light-emitting elements 30 may be in a range from about 30 nm to about 700 nm, and the aspect ratio of the light-emitting elements 30 may be in a range from about 1.2 to about 100. It is, however, to be understood that the present disclosure is not limited thereto. The plurality of light-emitting elements 30 included in the display device DD may have different diameters depending on compositional difference of the emissive layer 36. For example, the diameter of the light-emitting elements 30 may be approximately 500 nm.

The display device DD according to one or more embodiments may include a light-emitting element 30 directly on the first planarization layer 19. For example, an alignment electrode for aligning the light-emitting elements 30 may be eliminated. In a comparable device including an alignment electrode, the voltage applied to the alignment electrode for aligning the light-emitting elements 30 may cause damage to lines or electrodes included in the lower substrate 10. Additionally, the alignment electrode may form an electric field together with lines or electrodes included in the lower substrate 10. The electric field thus formed may provide a dielectrophoretic force to the light-emitting elements 30, and thus the light-emitting elements 30 may be aligned at undesirable positions.

For these reasons, by eliminating the alignment electrode, it is possible to reduce damage to the lines included in the lower substrate 10, and to align the light-emitting elements 30 more accurately.

Figure 8:
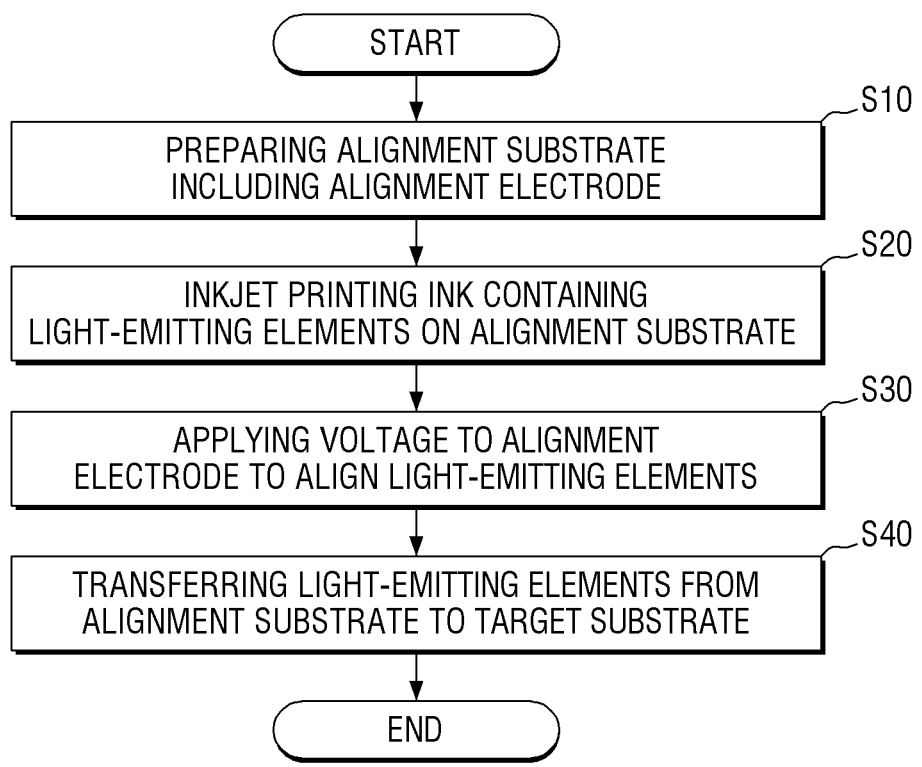
FIG. 8 is a flowchart for illustrating processing steps for fabricating a display device according to one or more embodiments of the present disclosure.

FIG. 8 is a flowchart for illustrating processing steps for fabricating a display device according to one or more embodiments of the present disclosure. FIGS. 9 to 14 are schematic views showing processing steps of fabricating a display device according to one or more embodiments of the present disclosure.

Referring to FIGS. 8 and 9 to 14, the process of fabricating a display device according to one or more embodiments may include preparing an alignment substrate including an alignment electrode (step S10), inkjet printing an ink containing light-emitting elements on the alignment substrate (step S20), applying a voltage to the alignment electrode to align the light-emitting elements (step S30), and transferring the light-emitting elements from the alignment substrate to a target substrate (step S40).

In the preparing the alignment substrate including the alignment electrode S10, the alignment substrate 100 according to one or more embodiments of the present disclosure may include an alignment base substrate 110, alignment electrodes 121 and 122 on the alignment base substrate 110 and spaced apart from each other, a capping layer 130 on the alignment base substrate 110 to cover the alignment electrodes 121 and 122, and a plurality of alignment banks 140 on the capping layer 130 and surrounding the alignment electrodes 121 and 122.

The alignment base substrate 110 may be an insulating substrate made of, but is not limited to, an insulating material such as glass, quartz and/or polymer resin. The alignment base substrate 110 may be made of one of molybdenum (Mo), aluminum (Al), chromium (Cr), gold (Au), titanium (Ti), nickel (Ni), neodymium (Nd) and copper (Cu), or an alloy thereof. The alignment base substrate 110 may be either a rigid substrate or a flexible substrate that can be bent, folded, and/or rolled.

The alignment banks 140 may prevent or reduce overflow of an ink during an inkjet printing process in the process of fabricating the display device DD. The alignment electrodes 121 and 122 include a first alignment electrode 121 and a second alignment electrode 122, and may be between the alignment banks 140. In one or more embodiments, a second alignment key AK2 may be positioned on the alignment banks 140. The second alignment key AK2 may be aligned with the above-described first alignment key AK1 (see FIG. 1), to assist in aligning the display device DD and the alignment substrate 100. It is, however, to be understood that the present disclosure is not limited thereto. The second alignment key AK2 may be in another area of the alignment substrate 100. The shape of the second alignment key AK2 may be substantially identical to the shape of the first alignment key AK1, in order to assist in aligning the display device DD with the alignment substrate 100. For example, the second alignment key AK2 may have the same cross shape as the first alignment key AK1. It is, however, to be understood that the present disclosure is not limited thereto.

The first and second alignment electrodes 121 and 122 may be extended in the second direction DR2 and may be spaced apart from each other and face each other in the first direction DR1. The first alignment electrode 121 and the second alignment electrode 122 may be used to form an electric field in the alignment substrate 100, in order to align the light-emitting elements 30. As will be described hereinbelow, the light-emitting elements 30 may be arranged between the first alignment electrode 121 and the second alignment electrode 122 by the electric field formed across on the first alignment electrode 121 and the second alignment electrode 122.

After the preparing the alignment substrate including the alignment electrode S10, the inkjet printing the ink containing the light-emitting elements on the alignment substrate S20 may be carried out.

An ink 200 containing the light-emitting elements 30 may be ejected onto the first alignment electrode 121 and the second alignment electrode 122 on the alignment base substrate 110. According to one or more embodiments of the present disclosure, the ink 200 may be ejected onto the alignment electrodes 121 and 122 via a printing process using an inkjet printing device. The ink 200 may be ejected through a nozzle Nozzle of an inkjet head included in the inkjet printing device. The ink 200 may include a solvent 300, a plurality of light-emitting elements 30 dispersed in the solvent 300, and a thickener 400 for changing the viscosity of the ink 200. The light-emitting elements 30 may be dispersed in the ink 200 with their extension direction orientated in random directions (e.g., in any direction).

The ink 200 may flow along an internal path formed in the inkjet head, and may be ejected onto the alignment base substrate 110 through the nozzle Nozzle. For example, the ink 200 may be ejected along the alignment electrodes 121 and 122. The ink 200 discharged from the nozzle Nozzle may be ejected onto the alignment electrodes 121 and 122 on the alignment base substrate 110. The ink 200 ejected on the alignment electrodes 121 and 122 may be confined by the alignment banks 140.

After the step S20 of the inkjet printing the ink containing the light-emitting elements over the alignment substrate, the step S30 of the aligning the light-emitting elements by applying a voltage to the alignment electrodes S30 may be carried out. When the ink containing the light-emitting elements 30 is ejected onto the alignment electrodes 121 and 122, an alignment signal is applied to the alignment electrodes 121 and 122 to generate an electric field. The alignment signal applied to the alignment electrodes 121 and 122 may be an alternating current (AC) voltage. The light-emitting elements 30 dispersed in the ink may be aligned on the alignment electrodes 121 and 122 by receiving a dielectrophoretic force due to the electric field formed across the alignment electrodes 121 and 122. The both ends of the light-emitting elements 30 may be on the first alignment electrode 121 and the second alignment electrode 122, respectively. The capping layer 130 may be between the light-emitting elements 30 and the alignment electrodes 121 and 122. According to one or more embodiments, the step S20 of the inkjet printing the ink containing the light-emitting elements over the alignment substrate, and the step S30 of aligning the light-emitting elements by applying a voltage to the alignment electrodes, may be carried out simultaneously (or concurrently).

Subsequently, the step S40 of transferring the light-emitting elements from the alignment substrate to a target substrate S40 may be carried out. In the following description, the term "transfer" may encompass not only moving an object by contact (e.g., by physical contact) due to a difference in adhesive force, but also moving an object by gravity and/or the like, without contact (e.g., without physical contact). As an example, the light-emitting elements 30 may be transferred, by gravity, onto the lower substrate 10 of the display device DD, i.e., a target substrate. For example, the alignment substrate 100 in which the light-emitting elements 30 are aligned is turned over and placed above the lower substrate 10 of the display device DD, so that the light-emitting elements 30 are pulled down by gravity and seated on the lower substrate 10 of the display device DD. To do so, a direct current (DC) voltage may be applied to the alignment electrodes 121 and 122. In one or more embodiments, ultrasonic waves may be applied to the rear surface of the alignment substrate 100 using an ultrasonic generator, or a roller may press the alignment substrate 100 to facilitate the transfer of the light-emitting elements 30.

When the alignment substrate 100 is turned over and placed above the lower substrate 10 of the display device DD, the first alignment key AK1 on the display device DD is aligned with the second alignment key AK2 on the alignment substrate 100. When the light-emitting elements 30 are transferred from the alignment substrate 100 to the lower substrate 10 of the display device DD, the orientation of the light-emitting elements 30 may be substantially maintained. It is, however, to be understood that the present disclosure is not limited thereto.

During the process of fabricating the display device DD according to one or more embodiments of the present disclosure, once the light-emitting elements 30 are seated on the lower substrate 10 of the display device DD, a first insulating layer 51, a first electrode 26, a second insulating layer 52, a second electrode 27, a third insulating layer 53, etc. may be sequentially formed via subsequent processes.

Figure 15:
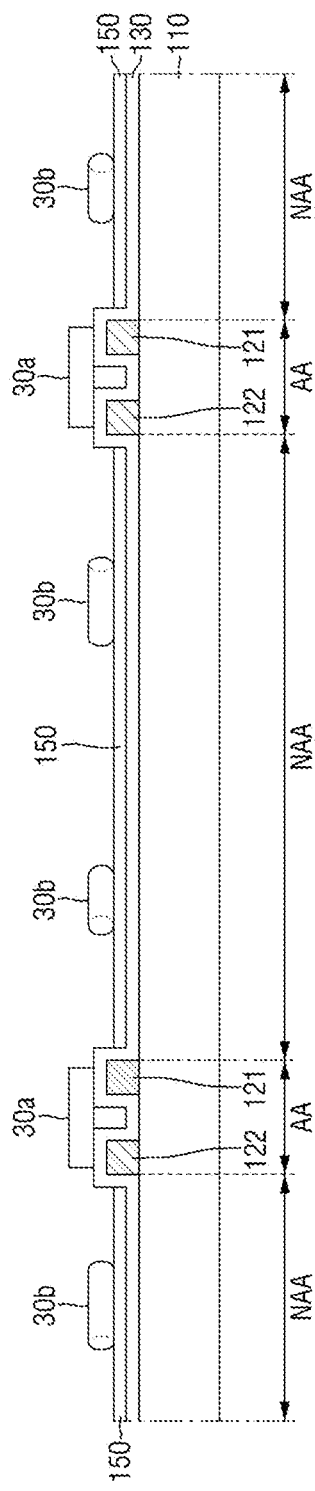
FIGS. 15 to 17 are schematic views illustrating some of processing steps of a method of fabricating a display device according to one or more embodiments.
Figure 16:
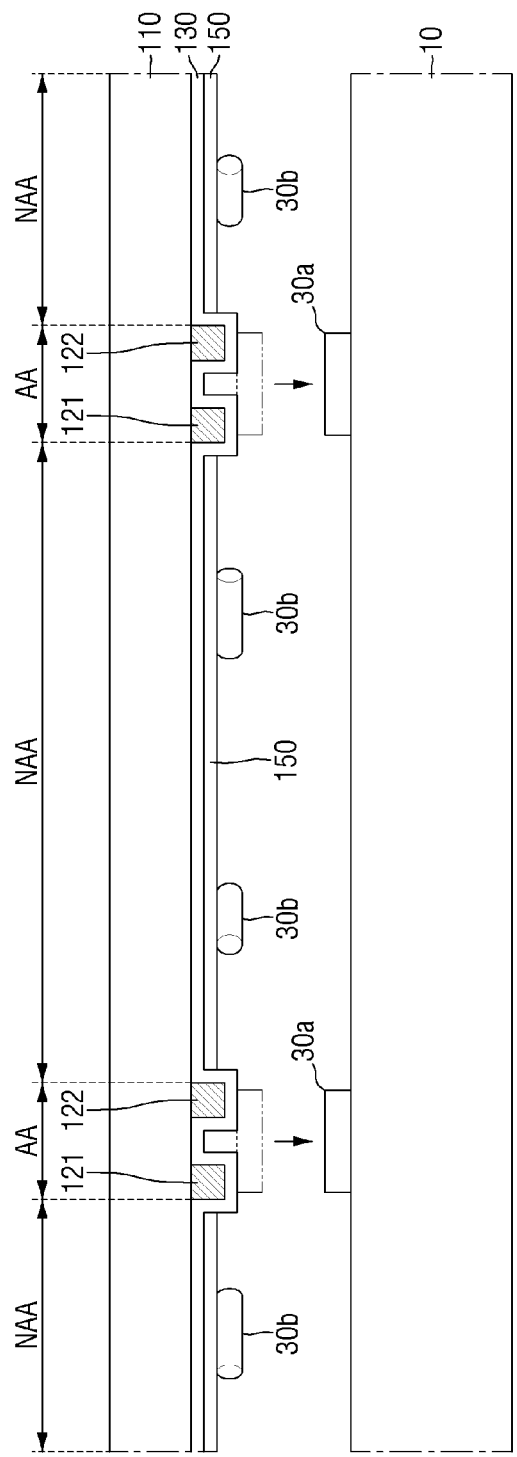
Figure 17:
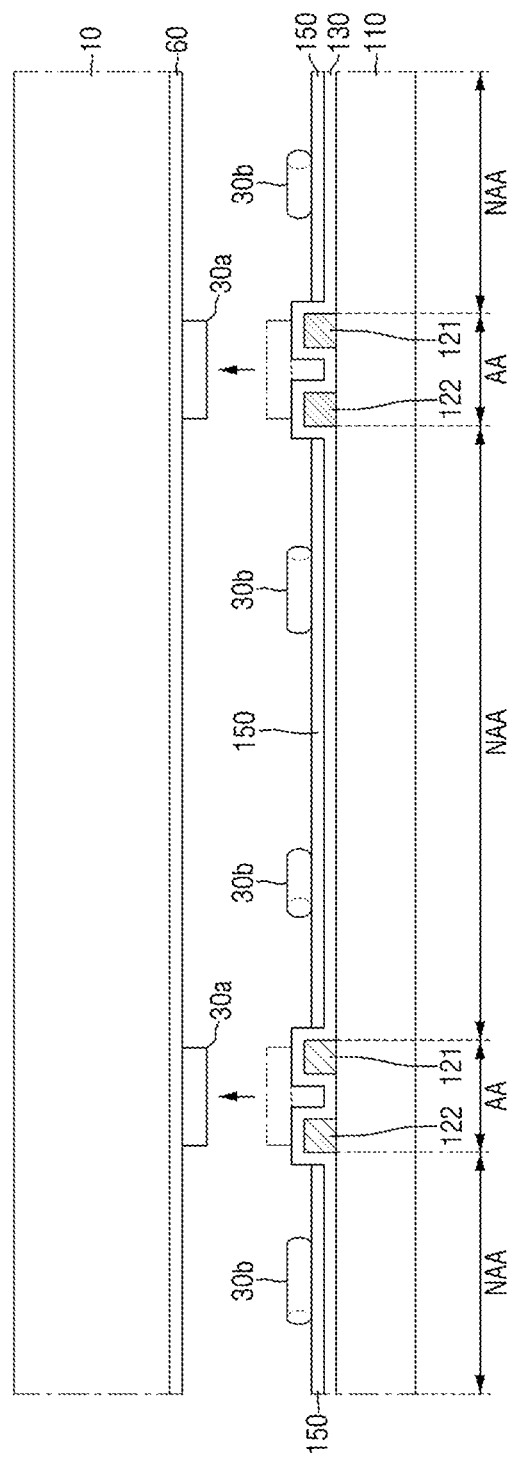

FIGS. 15 to 17 are schematic views showing some of processing steps of a method of fabricating a display device according to one or more embodiments of the present disclosure.

Figure 10:
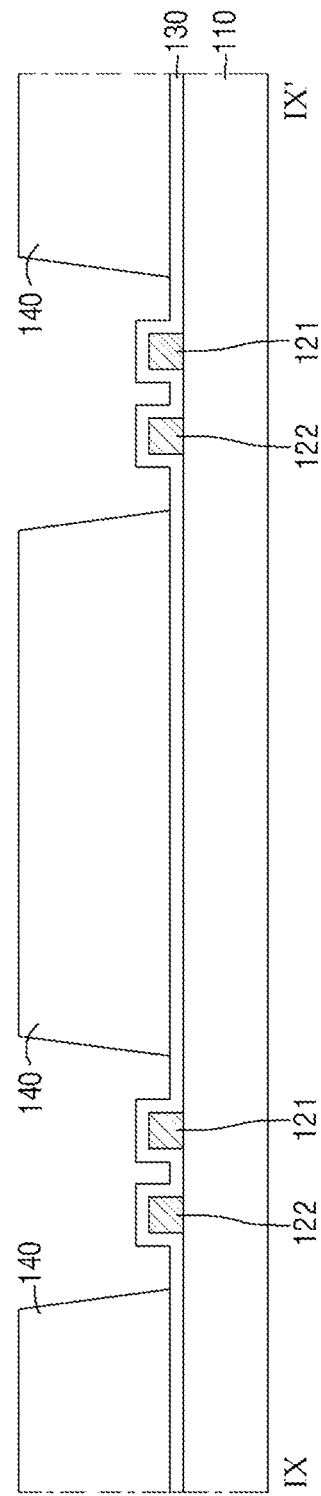
Figure 11:
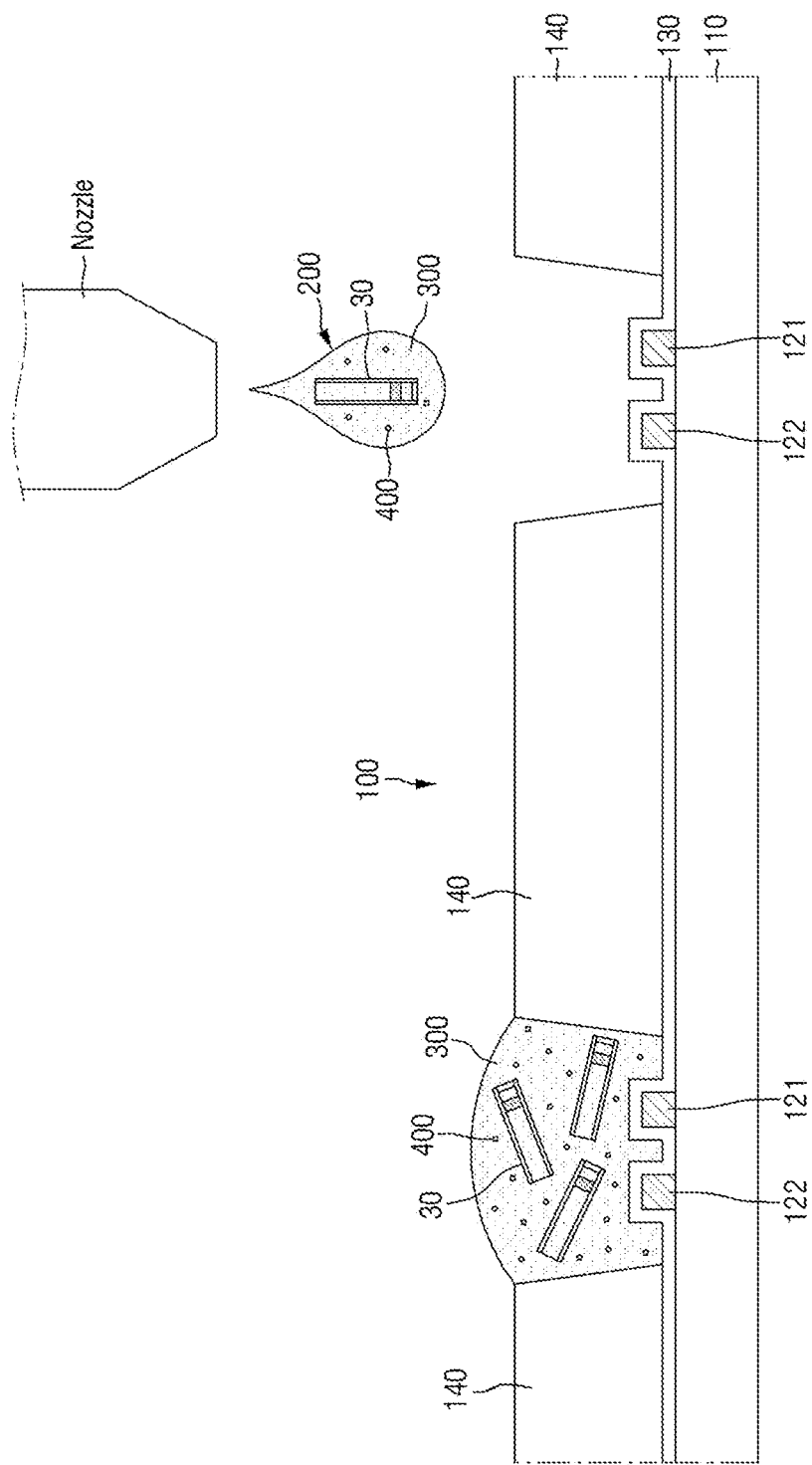
Figure 12:
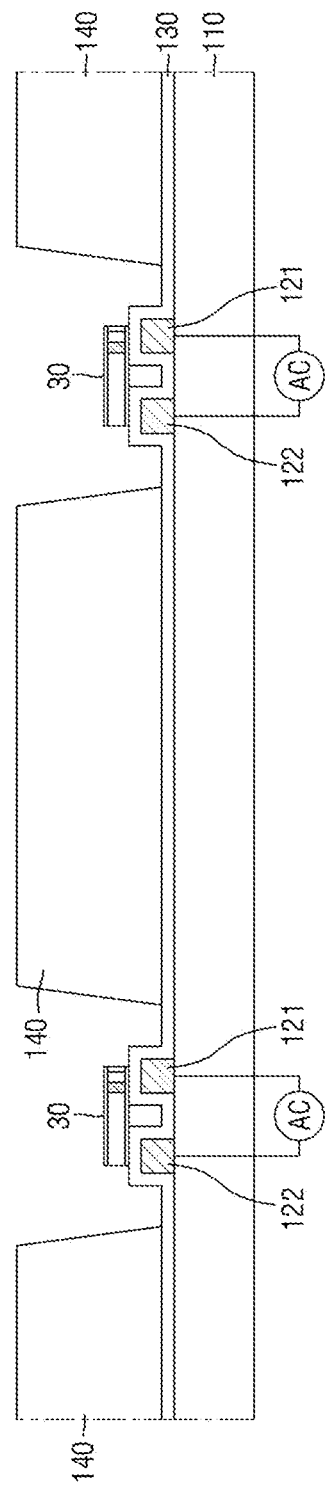
Figure 13:
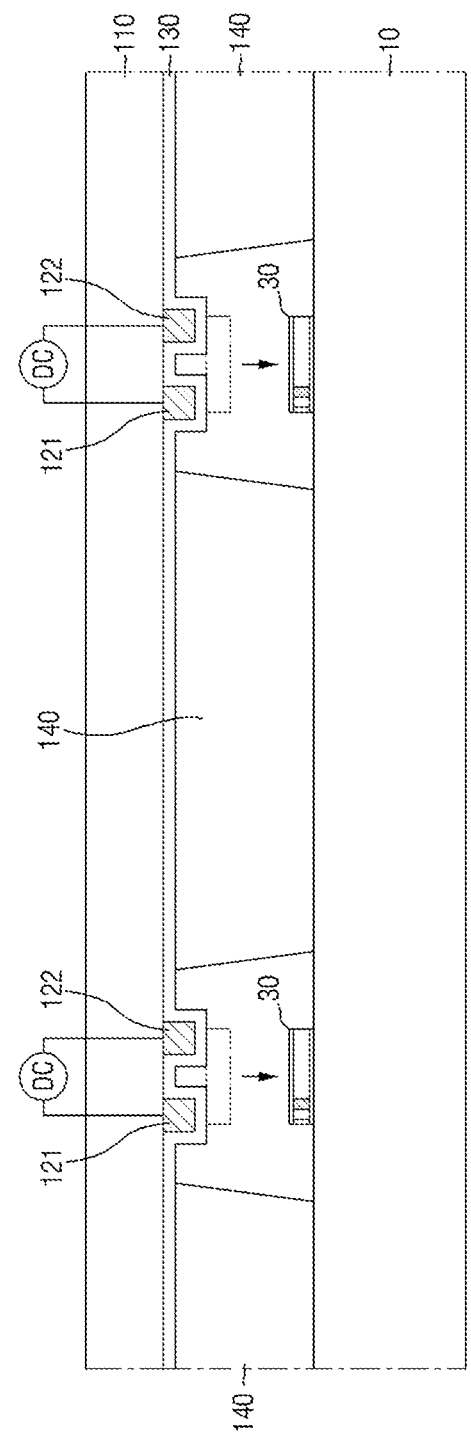
Figure 14:
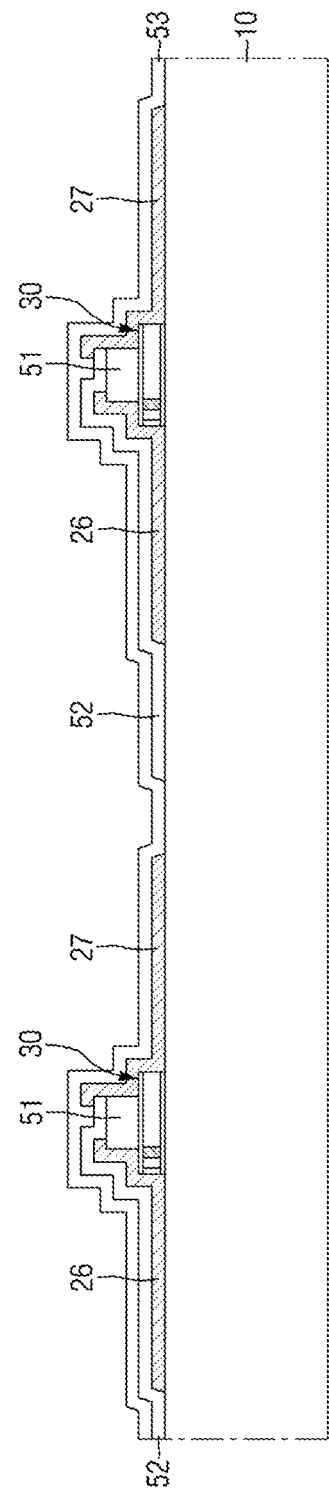

The embodiments of FIGS. 8 to 15 are substantially different from the embodiments of FIG. 10 in that an alignment substrate 100 according to the embodiments of FIG. 15 further includes an alignment adhesive layer 150, while the alignment banks 140 are eliminated. In addition, the alignment substrate 100 may include alignment areas AA that each extend from one end of the first alignment electrode 121 to the other end of the adjacent second alignment electrode 122, and non-alignment areas NAA covering regions other than the alignment areas AA.

The alignment adhesive layer 150 may be on the capping layer 130 in the non-alignment area NAA, but not on the capping layer 130 in the alignment area AA. The alignment adhesive layer 150 may attach the light-emitting elements 30*b* in the non-alignment area NAA to the alignment substrate 100. As the light-emitting elements 30*b* are attached to the alignment substrate 100 by the alignment adhesive layer 150, they may not be pulled down by gravity substantially, even when the alignment substrate 100 is turned over. The alignment adhesive layer 150 may be made of, but is not limited to, a material including an epoxy-based polymer such as SU-8, benzocyclobutene (BCB), polyimide (PI), polybenzoxazole (PBO), silicone (Si) and/or heat release coating.

When an ink 200 containing the light-emitting elements is ejected onto the alignment substrate 100, the light-emitting elements 30*a* and 30*b* may be positioned on the alignment substrate 100. In doing so, when an alignment signal is applied to the alignment electrodes 121 and 122, the light-emitting element 30*a* in the alignment area AA may be aligned in the direction perpendicular to the extension direction of the alignment electrodes 121 and 122. On the other hand, the light-emitting element 30*b* in the non-alignment area NAA may not be aligned but may be orientated in a random direction (e.g., in any direction).

Referring to FIG. 16, the light-emitting elements 30*a* aligned using the alignment substrate 100 according to the one or more embodiments of FIG. 15 may be transferred onto the lower substrate 10 of the display device DD, which is a target substrate. For example, the alignment substrate 100, in which the light-emitting elements 30*a* and 30*b* are aligned, is turned over and placed above the lower substrate 10 of the display device DD, so that the light-emitting elements 30*a* are pulled down by gravity and seated on the lower substrate 10 of the display device DD. In doing so, while the light-emitting elements 30*a* in the alignment areas AA are transferred onto the lower substrate 10 of the display device DD, the light-emitting elements 30*b* in the non-alignment areas NAA may not be transferred onto the lower substrate 10 of the display device DD due to the adhesive force of the alignment adhesive layer 150. When the light-emitting elements 30 are transferred from the alignment substrate 100 to the lower substrate 10 of the display device DD, the orientation of the light-emitting elements 30 may be substantially maintained. It is, however, to be understood that the present disclosure is not limited thereto.

Once the light-emitting elements 30*a* are seated on the lower substrate 10 of the display device DD, a first insulating layer 51, a first electrode 26, a second insulating layer 52, a second electrode 27 and a third insulating layer 53 may be sequentially formed via subsequent processes. In the method of fabricating the display device according to these embodiments, the light-emitting element 30*a* is first aligned using a separate alignment substrate 100 and then transferred to the lower substrate 10 of the display device DD. Accordingly, it is possible to reduce damage applied to the lines included in the lower surface 10, and the alignment of the light-emitting element 30*a* can be improved. The embodiments of FIG. 16 are substantially identical to the embodiments of FIG. 13, except that the alignment banks 140 are eliminated from the alignment substrate 100 and an alignment adhesive layer 150 is further included. In the above description, redundant descriptions of the same elements will not be provided.

Referring to FIG. 17, the light-emitting elements 30*a* aligned using the alignment substrate 100 according to the one or more embodiments of FIG. 15 may be transferred onto the lower substrate 10 of the display device DD, which is a target substrate. For example, the adhesive layer 60 is on the lower substrate 10 of the display device DD, and then the lower substrate 10 is brought into contact (e.g., physical contact) with the upper surface of the alignment substrate 100 according to the one or more embodiments of FIG. 15, so that the light-emitting elements 30*a* can be picked up. In doing so, the light-emitting elements 30*a* on the alignment areas AA in which the alignment adhesive layer 150 is not positioned may be attached to and picked up by the adhesive layer 60 on the lower substrate 10, whereas the light-emitting elements 30*b* on the non-alignment areas NAA in which the alignment adhesive layer 150 is positioned may not be attached to and not picked up by the adhesive layer 60 on the lower substrate 10.

The adhesive force between the adhesive layer 60 and the light-emitting elements 30*b* may be less than the adhesive force between the alignment adhesive layer 150 and the light-emitting elements 30*b*. As described above, the adhesive layer 60 may be made of, but is not limited to, a material including an epoxy-based polymer such as SU-8, benzocyclobutene (BCB), polyimide (PI), polybenzoxazole (PBO), silicone (Si) and/or heat release coating. The adhesive layer 60 may be made of such material that the adhesive force between the adhesive layer 60 and the light-emitting elements 30*b* is less than the adhesive force between the alignment adhesive layer 150 and the light-emitting elements 30*b*.

Once the light-emitting elements 30*a* are seated on the lower substrate 10 of the display device DD, a first insulating layer 51, a first electrode 26, a second insulating layer 52, a second electrode 27 and a third insulating layer 53 may be sequentially formed via subsequent processes. In the method of fabricating the display device according to these embodiments, the light-emitting element 30*a* is first aligned using a separate alignment substrate 100 and then transferred to the lower substrate 10 of the display device DD. Accordingly, it is possible to reduce damage applied to the lines included in the lower surface 10, and the alignment of the light-emitting element 30*a* can be improved.

Figure 18:
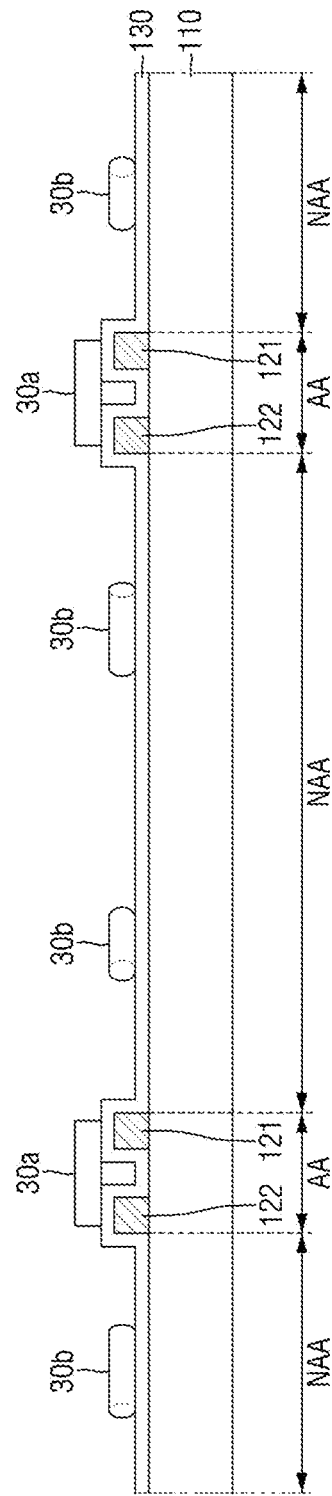
FIGS. 18 to 20 are schematic views illustrating some of processing steps of a method of fabricating a display device according to one or more embodiments.
Figure 19:
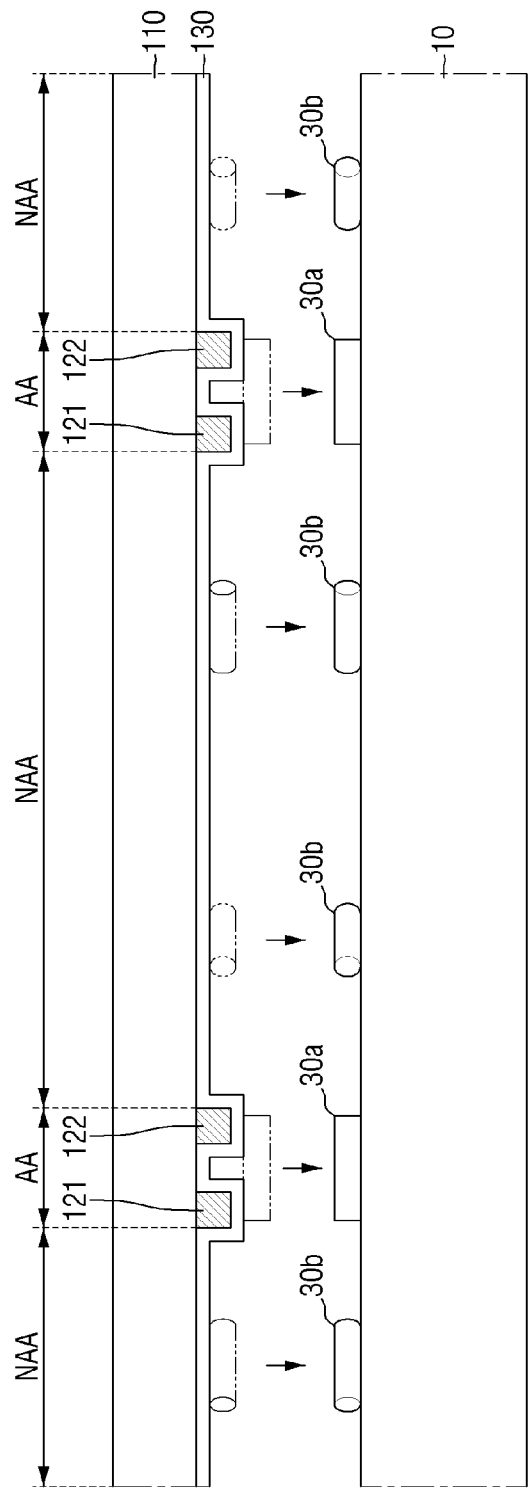
Figure 20:
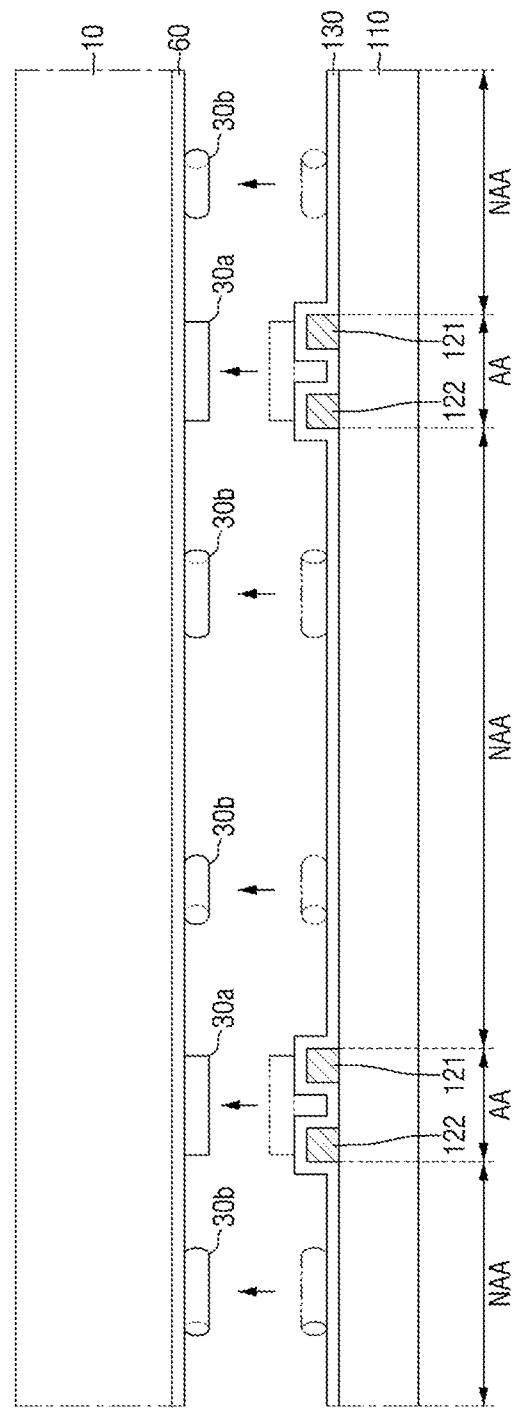

FIGS. 18 to 20 are schematic views illustrating some of processing steps of a method of fabricating a display device according to one or more embodiments.

Referring to FIGS. 8 and 18, the alignment substrate 100 according to the embodiments of FIG. 15 are different from the embodiments of FIG. 10 in that the alignment banks 140 are eliminated. In addition, the alignment substrate 100 may include alignment areas AA that each extend from one end of the first alignment electrode 121 to the other end of the adjacent second alignment electrode 122, and non-alignment areas NAA covering regions other than the alignment areas AA.

When an ink 200 containing the light-emitting elements is ejected onto the alignment substrate 100, the light-emitting elements 30*a* and 30*b* may be positioned on the alignment substrate 100. In doing so, when an alignment signal is applied to the alignment electrodes 121 and 122, the light-emitting element 30*a* in the alignment area AA may be aligned in the direction perpendicular to the extension direction of the alignment electrodes 121 and 122. On the other hand, the light-emitting element 30*b* in the non-alignment area NAA may not be aligned, but may be orientated in a random direction (e.g., in any direction).

Referring to FIG. 19, the light-emitting elements 30*a* aligned using the alignment substrate 100 according to the one or more embodiments of FIG. 18 may be transferred onto the lower substrate 10 of the display device DD, which is a target substrate. For example, the alignment substrate 100 in which the light-emitting elements 30*a* and 30*b* are aligned is turned over and placed above the lower substrate 10 of the display device DD, so that the light-emitting elements 30*a* and 30*b* are pulled down by gravity and seated on the lower substrate 10 of the display device DD. It is to be noted that the light-emitting elements 30*a* in the alignment areas AA, as well as the light-emitting elements 30*b* in the non-alignment areas NAA, may be transferred onto the lower substrate 10 of the display device DD. When the light-emitting elements 30 are transferred from the alignment substrate 100 to the lower substrate 10 of the display device DD, the orientation of the light-emitting elements 30 may be substantially maintained. It is, however, to be understood that the present disclosure is not limited thereto.

Once the light-emitting elements 30*a* and 30*b* are seated on the lower substrate 10 of the display device DD, a first insulating layer 51, a first electrode 26, a second insulating layer 52, a second electrode 27, a third insulating layer 53, etc. may be sequentially formed via subsequent processes. In the method of fabricating the display device according to these embodiments, the light-emitting elements 30*a* are first aligned using a separate alignment substrate 100 and then transferred to the lower substrate 10 of the display device DD. By doing so, it is possible to reduce damage applied to the lines included in the lower surface 10, and the light-emitting elements 30*a* can be aligned more accurately. The embodiments of FIG. 19 are substantially identical to the embodiments of FIG. 13, except that the alignment banks 140 are eliminated from the alignment substrate 100. In the above description, redundant descriptions of the same elements will not be provided.

Referring to FIG. 20, the light-emitting elements 30a aligned using the alignment substrate 100 according to the one or more embodiments of FIG. 18 may be transferred onto the lower substrate 10 of the display device DD, which is a target substrate. For example, an adhesive layer 60 may be on the lower substrate 10 of the display device DD, and the light-emitting elements 30a and 30b may be attached to and picked up by the adhesive layer 60 as the alignment substrate 100 according to the one or more embodiments of FIG. 15 is approached from the above. In doing so, the light-emitting elements 30a in the alignment areas AA, as well as the light-emitting elements 30b in the non-alignment areas NAA, may be attached to and picked up by the adhesive layer 60 on the lower substrate 10.

Once the light-emitting elements 30a and 30b are seated on the lower substrate 10 of the display device DD, a first insulating layer 51, a first electrode 26, a second insulating layer 52, a second electrode 27, a third insulating layer 53, etc. may be sequentially formed via subsequent processes.

In the method of fabricating the display device according to the embodiments of the present disclosure, the light-emitting elements 30a are first aligned using a separate alignment substrate 100 and then transferred to the lower substrate 10 of the display device DD. By doing so, it is possible to reduce damage applied to the lines included in the lower surface 10, and the light-emitting elements 30a can be aligned more accurately.

In concluding the detailed description, those skilled in the art will appreciate that many variations and modifications can be made to the embodiments, without substantially departing from the principles of the present disclosure. Therefore, the disclosed embodiments of the disclosure are used in a generic and descriptive sense only and not for purposes of limitation.

What is claimed is:

1. A display device comprising:
   a first substrate;
   a first conductive pattern, a first voltage line, and a second voltage line on the first substrate;
   an insulating layer on the first conductive pattern and the second voltage line;
   a plurality of first light-emitting elements on the insulating layer, wherein a longitudinal direction of the plurality of first light-emitting elements is along a first direction;
   a first electrode on the insulating layer and connected to the first conductive pattern through a first contact hole penetrating the insulating layer, at least a portion of the first electrode overlapping the first voltage line;
   a second electrode on the insulating layer and connected to the second voltage line through a second contact hole penetrating the insulating layer, and
   a plurality of second light-emitting elements on the insulating layer,
   wherein the plurality of first light-emitting elements are in an area that extends along a second direction crossing the first direction,
   wherein a side surface of a first end of each of the plurality of first light-emitting elements in the longitudinal direction is in contact with the first electrode,
   wherein a side surface of a second end of each of the plurality of first light-emitting elements in the longitudinal direction is in contact with the second electrode,
   wherein the plurality of second light-emitting elements are in an area adjacent in the second direction to the area where the first light-emitting elements are,
   wherein the plurality of second light-emitting elements do not contact the first electrode and do not contact the second electrode in any pixel of the display device, and
   wherein a part of an upper surface of the first electrode that overlaps the first conductive pattern and a part of the upper surface of the first electrode that overlaps the first voltage line are located on a same plane.

2. The display device of claim 1,
   wherein a longitudinal direction of each of the plurality of second light-emitting elements is along the first direction.

3. The display device of claim 2, wherein the first electrode and the second electrode in a pixel row are respectively separated from first electrodes and second electrodes in other pixel rows arranged in the second direction, and
   wherein the plurality of second light-emitting elements are at boundaries between the pixel rows where the first electrode and the second electrode are not located.

4. The display device of claim 3, wherein, when viewed from the top, the plurality of second light-emitting elements do not overlap the first electrode or the second electrode in any pixel of the display device when the plurality of second light-emitting elements are extended in the longitudinal direction.

5. The display device of claim 3, wherein the plurality of second light-emitting elements does not overlap the first electrode or the second electrode in a thickness direction of the display device in any pixel of the display device.

6. The display device of claim 1, wherein the first electrode and the second electrode are spaced apart from each other.

7. The display device of claim 6, wherein the first end of each of the plurality of first light-emitting element overlaps the first electrode, and the second end thereof overlaps the second electrode.

8. The display device of claim 7, wherein a distance between the first electrode and the second electrode in the first direction is smaller than a length of the first light-emitting element in the first direction.

9. The display device of claim 7, wherein the first end of each of the plurality of first light-emitting elements is between the insulating layer and the first electrode, and
   wherein the second end of each of the plurality of first light-emitting elements is between the insulating layer and the second electrode.

10. The display device of claim 1, further comprising:
    an adhesive layer on the insulating layer.

11. The display device of claim 10, wherein the first contact hole and the second contact hole penetrate the adhesive layer.

12. The display device of claim 1, wherein at least a part of each of the first electrode and the second electrode is directly on the insulating layer.

13. The display device of claim 1, further comprising:
    a plurality of banks extended in the second direction; and
    a third electrode on the plurality of banks,
    wherein the plurality of banks are on one side of the first electrode in the first direction and on an opposite side of the second electrode in the first direction, respectively.

* * * * *